United States Patent
Wei et al.

(10) Patent No.: US 11,949,420 B2
(45) Date of Patent: Apr. 2, 2024

(54) CLOCK SPREAD SPECTRUM CIRCUIT, ELECTRONIC EQUIPMENT, AND CLOCK SPREAD SPECTRUM METHOD

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xiangye Wei, Beijing (CN); Liming Xiu, Beijing (CN); Yuhai Ma, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 28 days.

(21) Appl. No.: 17/837,214

(22) Filed: Jun. 10, 2022

(65) Prior Publication Data

US 2022/0311428 A1    Sep. 29, 2022

Related U.S. Application Data

(63) Continuation-in-part of application No. 16/980,930, filed as application No. PCT/CN2019/083901 on Apr. 23, 2019, now Pat. No. 11,381,229.

(51) Int. Cl.
*H03K 5/156* (2006.01)
*G06F 7/501* (2006.01)
(Continued)

(52) U.S. Cl.
CPC ........... *H03K 5/1565* (2013.01); *G06F 7/501* (2013.01); *H03K 5/15066* (2013.01); *H03K 5/26* (2013.01)

(58) Field of Classification Search
CPC .... H03K 5/1252; H03K 5/00006; H03K 4/06; H03K 4/08; G06F 1/04
See application file for complete search history.

(56) References Cited

U.S. PATENT DOCUMENTS 8,120,389 B2 * 2/2012 Xiu ........................... H03L 7/16
327/107
11,196,454 B2 * 12/2021 Wei ........................... H04B 1/40
(Continued)

FOREIGN PATENT DOCUMENTS

CN    101404569 A    4/2009
CN    101515913 A    8/2009
(Continued)

OTHER PUBLICATIONS

International Search Report and Written Opinion from PCT/CN2019/083901 dated Jan. 23, 2020.
(Continued)

*Primary Examiner* — John W Poos
(74) *Attorney, Agent, or Firm* — Michael J. Musella, Esq.; Dilworth & Barrese, LLP.

(57) ABSTRACT

A clock spread spectrum circuit, an electronic equipment, and a clock spread spectrum method are disclosed. The clock spread spectrum circuit includes a control circuit, a signal generation circuit, and a duty cycle adjustment circuit. The duty cycle adjustment circuit is configured to generate a target voltage having a duty cycle that is equal to a target duty cycle, the control circuit is configured to generate a frequency control word according to a modulation parameter, and the frequency control word changes discretely with time; and the signal generation circuit is configured to receive the target voltage and the frequency control word and generate and output a spread spectrum output signal that is spectrum-spread according to the target voltage and the frequency control word, and the spread spectrum output
(Continued)

signal corresponds to the frequency control word and a duty cycle of the spread spectrum output signal is the target duty cycle.

20 Claims, 15 Drawing Sheets

(51) Int. Cl.
*H03K 5/15* (2006.01)
*H03K 5/26* (2006.01)

(56) References Cited

U.S. PATENT DOCUMENTS

| | | | | |
|---|---|---|---|---|
| 11,381,229 B2* | 7/2022 | Wei | ................. | H03K 5/1252 |
| 2009/0160493 A1* | 6/2009 | You | ................. | H04B 15/02 |
| | | | | 327/105 |
| 2018/0196460 A1 | 7/2018 | Xiu | | |
| 2019/0052276 A1 | 2/2019 | Xiu | | |
| 2021/0075426 A1 | 3/2021 | Wei | | |

FOREIGN PATENT DOCUMENTS

| | | |
|---|---|---|
| CN | 102104394 A | 6/2011 |
| CN | 106708166 A | 5/2017 |
| CN | 108964660 A | 12/2018 |
| WO | 2004092935 A | 10/2004 |

OTHER PUBLICATIONS

Non-final Office Action from U.S. Appl. No. 16/980,930 dated Jul. 26, 2021.
Final Office Action from U.S. Appl. No. 16/980,930 dated Dec. 14, 2021.
Office Action from U.S. Appl. No. 17/836,419 dated Mar. 13, 2023.

\* cited by examiner

CLOCK SPREAD SPECTRUM CIRCUIT, ELECTRONIC EQUIPMENT, AND CLOCK SPREAD SPECTRUM METHOD

CROSS-REFERENCE TO RELATED APPLICATION

This application is a continuation-in-part of application Ser. No. 16/980,930, filed Sep. 15, 2020 which was the National Stage of international Application No. PCT/CN2019/083901, filed Apr. 23, 2019, the entire disclosures each of which are hereby entirely incorporated by reference.

TECHNICAL FIELD

Embodiments of the present disclosure relate to a clock spread spectrum circuit, an electronic equipment, and a clock spread spectrum method.

BACKGROUND

Electromagnetic interference (EMI) refers to the influence of the circuit system on the surrounding circuit system through conduction or radiation. Electromagnetic interference may degrade the circuit performance, and may even cause the failure of the entire circuit system. The clock signal is usually the signal with the highest frequency and steepest edge in the circuit system, and most electromagnetic interference problems are related to high frequency clock signals. Methods for reducing electromagnetic interference include shielding, filtering, isolation, signal edge control, layout of the printed circuit board (PCB) such as providing a power layer and a ground (GND) layer in the PCB, etc. However, these methods have high cost and low efficiency, and also have a certain negative impact on the performance of the circuit system.

Clock spread spectrum is another effective method for reducing the EMI. The clock spread spectrum disperses the energy concentrated in a narrow frequency band to a predetermined wide frequency band by means of frequency modulation, so that the amplitude (energy) of the clock at the fundamental frequency and the odd harmonic wave frequency may be reduced to achieve the purpose of reducing the peak value of electromagnetic radiation of the system.

SUMMARY

At least one embodiment of the present disclosure provides a clock spread spectrum circuit, comprising: a control circuit, configured to generate a frequency control word according to a modulation parameter, the frequency control word changing discretely with time; and a signal generation circuit, configured to receive the frequency control word and generate and output a spread spectrum output signal that is spectrum-spread according to the frequency control word, the spread spectrum output signal corresponding to the frequency control word.

For example, in the clock spread spectrum circuit provided by at least one embodiment of the present disclosure, the frequency control word is expressed as: $F(t)=I+r(t)$, where $F(t)$ is the frequency control word, I is an integer part of the frequency control word, I is a constant and an integer, $r(t)$ is a decimal part of the frequency control word, $r(t)$ is a decimal and discretely changes with the time, and t represents the time.

At least one embodiment of the present disclosure provides a clock spread spectrum circuit, comprising: a duty cycle adjustment circuit, configured to generate a target voltage having a duty cycle that is equal to a target duty cycle; a control circuit, configured to generate a frequency control word according to a modulation parameter; and a signal generation circuit, configured to receive the target voltage and the frequency control word and generate and output a spread spectrum output signal that is spectrum-spread according to the target voltage and the frequency control word. The frequency control word changes discretely with time, the spread spectrum output signal corresponds to the frequency control word, and a duty cycle of the spread spectrum output signal is the target duty cycle; the frequency control word is expressed as: $F(t)=I+r(t)$, $F(t)$ is the frequency control word, I is an integer part of the frequency control word, I is a constant and an integer, $r(t)$ is a decimal part of the frequency control word, $r(t)$ is a decimal and discretely changes with the time, and t represents the time.

For example, in the clock spread spectrum circuit provided by at least one embodiment of the present disclosure, the duty cycle adjustment circuit comprises a duty cycle control signal generation sub-circuit, a voltage conversion sub-circuit, and an initial voltage generation sub-circuit, the duty cycle control signal generation sub-circuit is configured to generate a duty cycle control signal having a duty cycle that is equal to the target duty cycle, the initial voltage generation sub-circuit is configured to generate an initial voltage, and the voltage conversion sub-circuit is configured to convert the initial voltage based on the duty cycle control signal to obtain the target voltage.

For example, in the clock spread spectrum circuit provided by at least one embodiment of the present disclosure, the duty cycle control signal generation sub-circuit comprises: a control word providing module and a duty cycle control signal generation module; the control word providing module is configured to obtain the target duty cycle, generate a first duty cycle control word and a second duty cycle control word based on the target duty cycle, and output the first duty cycle control word and the second duty cycle control word to the duty cycle control signal generation module, wherein a ratio of the first duty cycle control word and the second duty cycle control word is equal to the target duty cycle; the duty cycle control signal generation module is configured to, in response to the first duty cycle control word and the second duty cycle control word, generate the duty cycle control signal.

For example, in the clock spread spectrum circuit provided by at least one embodiment of the present disclosure, the duty cycle control signal generation module comprises: a comparison sub-module, a generation sub-module, and an output selection sub-module; the control word providing module is configured to output the first duty cycle control word and the second duty cycle control word to the comparison sub-module; the comparison sub-module is configured to judge whether the first duty cycle control word and the second duty cycle control word are equal or not, output the first duty cycle control word and the second duty cycle control word to the generation sub-module and output a first control signal to the output selection sub-module if the first duty cycle control word and the second duty cycle control word are not equal; and output a second control signal to the output selection sub-module if the first duty cycle control word and the second duty cycle control word are equal; the generation sub-module is configured to generate the duty cycle control signal and output the duty cycle control signal to the output selection sub-module in response to receiving the first duty cycle control word and the second duty cycle control word; and the output selection sub-module is configured to output the duty cycle control signal generated by the generation sub-module in response to receiving the first control signal, and output a default control signal having a duty cycle that is equal to 1 as the duty cycle control signal in response to receiving the second control signal.

For example, in the clock spread spectrum circuit provided by at least one embodiment of the present disclosure, the generation sub-module comprises: a base output signal generation unit and a duty cycle control signal generation unit; the base output signal generation unit is configured to generate a plurality of first base output signals and output the plurality of first base output signals to the duty cycle control signal generation unit, wherein a phase difference between any two adjacent first base output signals is equal to a fixed value; the duty cycle control signal generation unit is configured to generate the duty cycle control word based on the plurality of first base output signals, and the first duty cycle control word and the second duty cycle control word output by the comparison sub-module, and output the duty cycle control signal to the output selection sub-module.

For example, in the clock spread spectrum circuit provided by at least one embodiment of the present disclosure, the duty cycle control signal generation unit comprises: an input unit, a selection unit, and an output unit; the input unit is configured to output a selection control signal to the selection unit based on the first duty cycle control word and the second duty cycle control word; the selection unit is configured to select a first base output signal from the plurality of first base output signals as a target first base output signal in response to the selection control signal and output the target first base output signal to the output unit; and the output unit is configured to generate the duty cycle control signal based on the target first base output signal, and output the duty cycle control signal to the output selection sub-module.

For example, in the clock spread spectrum circuit provided by at least one embodiment of the present disclosure, the input unit comprises: a first register, a second register, a third register, a fourth register, a first adder, and a second adder; the selection unit comprises: a first selector, a second selector, and a third selector; the output unit comprises: a D flip-flop, a first inverter, and a second inverter; the first adder and the second adder are connected to the control word providing module; the first adder, the first register, the second register, and the first selector are connected in sequence; the second adder, the third register, the fourth register, and the second selector are connected in sequence; the second register is also connected to a first clock signal terminal; the first register, the third register, and the fourth register are also connected to a second clock signal terminal; the first adder is configured to add the first duty cycle control word and information stored in the third register to obtain a first addition result, and store the first addition result in the first register at a first rising edge of a second clock signal provided by the second clock signal terminal connected to the first register, the second register is configured to store the first addition result stored in the first register at a first rising edge of a first clock signal provided by the first clock signal terminal connected to the second register, and output the first addition result to the first selector; the second adder is configured to add the second duty cycle control word and the information stored in the third register to obtain a second addition result, and store the second addition result in the third register at a second rising edge of the second clock signal provided by the second clock signal terminal connected to the third register, the fourth register is configured to store the second addition result stored in the third register at a third rising edge of the second clock signal provided by the second clock signal terminal connected to the fourth register, and output the second addition result to the second selector; the selection control signal comprises the first addition result and the second addition result, the first selector and the second selector are connected to the base output signal generation unit and the third selector, and the third selector is also connected to a first input end of the D flip-flop and the first clock signal terminal; the first selector is configured to select a first base output signal from the plurality of first base output signals as a first selected first base output signal in response to the first addition result output by the second register, and output the first selected first base output signal to the third selector; the second selector is configured to select a first base output signal from the plurality of first base output signals as a second selected first base output signal in response to the second addition result output by the fourth register, and output the second selected first base output signal to the third selector; the third selector is configured to select one of the first selected first base output signal and the second selected first base output signal as the target first base output signal at a second rising edge of the first clock signal provided by the first clock signal terminal, and output the target first base output signal to the D flip-flop; a second input end of the D flip-flop is connected to an output end of the first inverter, an input end of the first inverter and an input end of the second inverter are both connected to an output end of the D flip-flop, and the D flip-flop is configured to generate the duty cycle control signal based on the target first base output signal and output the duty cycle control signal to the output selection sub-module.

For example, in the clock spread spectrum circuit provided by at least one embodiment of the present disclosure, the first duty cycle control word and the second duty cycle control word both are positive integers.

For example, in the clock spread spectrum circuit provided by at least one embodiment of the present disclosure, the control word providing module comprises: a controller and a memory, the memory stores a plurality of duty cycle control word pairs, each of the plurality of duty cycle control word pairs comprises a first candidate duty cycle control word and a second candidate duty cycle control word, a plurality of candidate ratios corresponding to the plurality of duty cycle control word pairs are different from each other, wherein a candidate ratio corresponding to a duty cycle control word pair represents a ratio of a first candidate duty cycle control word and a second candidate duty cycle control word comprised in the duty cycle control word pair; the controller is configured to determine a target duty cycle control word pair from the plurality of duty cycle control word pairs based on the target duty cycle, wherein a ratio of a first candidate duty cycle control word and a second candidate duty cycle control word comprised in the target duty cycle control word pair is equal to the target duty cycle; the controller is further configured to determine the first candidate duty cycle control word comprised in the target duty cycle control word pair as the first duty cycle control word, and determine the second candidate duty cycle control word comprised in the target duty cycle control word pair as the second duty cycle control word.

For example, in the clock spread spectrum circuit provided by at least one embodiment of the present disclosure, the modulation parameter comprises a spread spectrum depth coefficient, a spread spectrum reference value, a modulation rate, a reference frequency, and a modulation mode, which correspond to the spread spectrum output signal, and the control circuit comprises: a decimal generation sub-circuit, configured to generate the decimal part according to the spread spectrum depth coefficient, the spread spectrum reference value, the modulation mode, and the modulation rate; an integer generation sub-circuit, configured to generate the integer part according to the reference frequency; and a synthesis sub-circuit, configured to receive the decimal part and the integer part and generate the frequency control word based on the decimal part and the integer part.

For example, in the clock spread spectrum circuit provided by at least one embodiment of the present disclosure, the decimal generation sub-circuit comprises: a frequency modulation control module, configured to generate a frequency modulation clock signal according to the modulation rate to control a rate of change of the frequency control word; and a decimal generation module, configured to generate and output the decimal part to the synthesis sub-circuit according to the modulation mode, the spread spectrum depth coefficient, and the spread spectrum reference value under control of the frequency modulation clock signal.

For example, in the clock spread spectrum circuit provided by at least one embodiment of the present disclosure, the decimal generation module comprises a modulation mode sub-module, the modulation mode comprises a triangle modulation mode, a sawtooth modulation mode, a sinusoidal modulation mode, or a random modulation mode, and the modulation mode sub-module is configured to generate the decimal part by using any one modulation mode selected from a group consisting of the triangle modulation mode, the sawtooth modulation mode, the sinusoidal modulation mode, and the random modulation mode.

For example, in the clock spread spectrum circuit provided by at least one embodiment of the present disclosure, the frequency modulation control module comprises: a counting sub-module, configured to count a reference clock signal to obtain a count value of the reference clock signal; and a timing sub-module, configured to determine a count period according to the modulation rate and determine the frequency modulation clock signal based on the count period and the count value.

For example, in the clock spread spectrum circuit provided by at least one embodiment of the present disclosure, the signal generation circuit comprises: a base time unit generation sub-circuit, configured to generate and output a base time unit; and a spread spectrum sub-circuit, configured to generate and output the spread spectrum output signal according to the frequency control word and the base time unit.

For example, in the clock spread spectrum circuit provided by at least one embodiment of the present disclosure, the signal generation circuit comprises: a base time unit generation sub-circuit, configured to receive the target voltage and generate and output a base time unit based on the target voltage; and a spread spectrum sub-circuit, configured to generate and output the spread spectrum output signal according to the frequency control word and the base time unit.

For example, in the clock spread spectrum circuit provided by at least one embodiment of the present disclosure, the base time unit generation sub-circuit comprises: a voltage-controlled oscillator, configured to oscillate at a predetermined oscillation frequency; a phase-locked loop circuit, configured to lock an output frequency of the voltage-controlled oscillator to a base output frequency; and K output terminals, configured to output K second base output signals with phases evenly spaced, K is a positive integer greater than 1, and the base output frequency is expressed as $f_d$, the base time unit is a time span between any two adjacent second base output signals output by the K output terminals, the base time unit is expressed as $\Delta$, and $\Delta=1/(K \cdot f_d)$.

For example, in the clock spread spectrum circuit provided by at least one embodiment of the present disclosure, the base time unit generation sub-circuit comprises: a voltage-controlled oscillator, configured to oscillate at a frequency of the target voltage; a phase-locked loop circuit, configured to lock an output frequency of the voltage-controlled oscillator to a base output frequency; and K output terminals, configured to output K second base output signals with phases evenly spaced, K is a positive integer greater than 1, and the base output frequency is expressed as $f_d$, the base time unit is a time span between any two adjacent second base output signals output by the K output terminals, the base time unit is expressed as $\Delta$, and $\Delta=1/(K \cdot f_d)$, and a duty cycle of each of the K second base output signals is the target duty cycle.

For example, in the clock spread spectrum circuit provided by at least one embodiment of the present disclosure, the spread spectrum sub-circuit is a time average frequency direct period synthesizer.

For example, in the clock spread spectrum circuit provided by at least one embodiment of the present disclosure, a maximum value of the frequency control word and a minimum value of the frequency control word satisfy a formula: $0 \leq Fmax - Fmin < 1$, and Fmin represents the minimum value of the frequency control word, and Fmax represents the maximum value of the frequency control word.

At least one embodiment of the present disclosure also provides an electronic equipment, comprising: the clock spread spectrum circuit according to any one of the above embodiments.

At least one embodiment of the present disclosure also provides a clock spread spectrum method, applied to the clock spread spectrum circuit according to any one of the above embodiments, and the clock spread spectrum method comprises: generating the frequency control word according to the modulation parameter, the frequency control word changing discretely with the time; and receiving the frequency control word, and generating and outputting the spread spectrum output signal that is spectrum-spread according to the frequency control word, the spread spectrum output signal corresponding to the frequency control word.

At least one embodiment of the present disclosure also provides a clock spread spectrum method, applied to the clock spread spectrum circuit according to any one of the above embodiments, and the clock spread spectrum method comprises: generating the target voltage having the duty cycle that is equal to the target duty cycle; generating the frequency control word according to the modulation parameter; and receiving the target voltage and the frequency control word, and generating and outputting the spread spectrum output signal that is spectrum-spread according to the target voltage and the frequency control word.

For example, in the clock spread spectrum method provided by at least one embodiment of the present disclosure, the frequency control word comprises a decimal part and an integer part, the modulation parameter comprises a spread spectrum depth coefficient, a spread spectrum reference value, a modulation mode, a modulation rate, and a reference frequency, which correspond to the spread spectrum output signal, and generating the frequency control word according to the modulation parameter comprises: generating the decimal part according to the spread spectrum depth coefficient, the spread spectrum reference value, the modulation mode, and the modulation rate, the decimal part being a decimal and changing discretely with the time; generating the integer part according to the reference frequency, the integer part being an integer; and generating the frequency control word according to the decimal part and the integer part.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
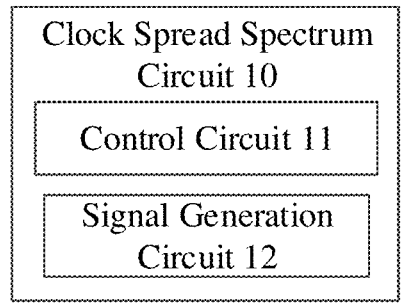
FIG. 1A is a schematic block diagram of a clock spread spectrum circuit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following descriptions of the embodiments of the present disclosure clear and concise, the present disclosure omits detailed descriptions of some known functions and known components.

With development of technology, the frequency of the clock signal is getting higher and higher, and the high frequency clock signal has strong electromagnetic interference. Currently, in order to effectively reduce the electromagnetic interference, periodic jitter may be introduced into the clock signal to implement the clock spread spectrum function to reduce the electromagnetic interference, that is, to allow respective periods of the clock signal to be different, in this way, the frequency spectrum of the clock signal may be a broadband spectrum, rather than a particularly pure peak. However, this method makes respective periods of the clock signal different, and if such a clock signal is used to drive a digital circuit, the setup time and the hold time of the digital circuit cannot be determined, so it is difficult to determine the parameter of clock spread spectrum.

At least some embodiments of the present disclosure provide a clock spread spectrum circuit, an electronic equipment, and a clock spread spectrum method, and the clock spread spectrum circuit includes a control circuit and a signal generation circuit. The control circuit is configured to generate a frequency control word according to a modulation parameter, and the frequency control word changes discretely with time; and the signal generation circuit is configured to receive the frequency control word and generate and output a spread spectrum output signal that is spectrum-spread according to the frequency control word, and the spread spectrum output signal corresponds to the frequency control word.

The clock spread spectrum circuit is based on time-average-frequency direct-period-synthesis (TAF-DPS) technology, uses TAF-DPS to generate the clock spread spectrum signal, can achieve to turn on spread spectrum functions of various modulation modes (such as a triangle wave modulation mode, and a sawtooth wave modulation mode) through the same circuit, and can not introduce additional noise when the spread spectrum function is turned on, that is, can effectively reduce the electromagnetic interference without affecting the normal operation of the circuit system. In addition, the clock spread spectrum circuit is an all-digital circuit, and has the advantages such as low power consumption, small size, programmable, and easy to be integrated in various chips.

At least some embodiments of the present disclosure provide a clock spread spectrum circuit, and the clock spread spectrum circuit includes a duty cycle adjustment circuit, a control circuit, and a signal generation circuit. The duty cycle adjustment circuit is configured to generate a target voltage having a duty cycle that is equal to a target duty cycle; the control circuit is configured to generate a frequency control word according to a modulation parameter; and the signal generation circuit is configured to receive the target voltage and the frequency control word and generate and output a spread spectrum output signal that is spectrum-spread according to the target voltage and the frequency control word. The frequency control word changes discretely with time, the spread spectrum output signal corresponds to the frequency control word, and a duty cycle of the spread spectrum output signal is the target duty cycle.

The clock spread spectrum circuit is based on TAF-DPS technology, uses TAF-DPS to generate the clock spread spectrum signal, can achieve to turn on spread spectrum functions of various modulation modes (such as a triangle wave modulation mode, and a sawtooth wave modulation mode) through the same circuit, and cannot introduce additional noise when the spread spectrum function is turned on, that is, can effectively reduce the electromagnetic interference without affecting the normal operation of the circuit system, besides, in the case of achieving the spread spectrum function, the clock spread spectrum circuit can adjust the duty cycle of the spread spectrum output signal. In addition, the clock spread spectrum circuit is an all-digital circuit, and has the advantages such as low power consumption, small size, programmable, and easy to be integrated in various chips.

Hereinafter, the embodiments of the present disclosure are described in detail with reference to the accompanying drawings, but the present disclosure is not limited to these specific embodiments.

Figure 1B:
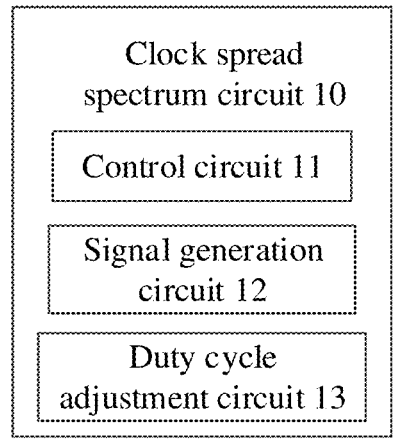
FIG. 1B is a schematic block diagram of another clock spread spectrum circuit provided by some embodiments of the present disclosure.
Figure 2A:
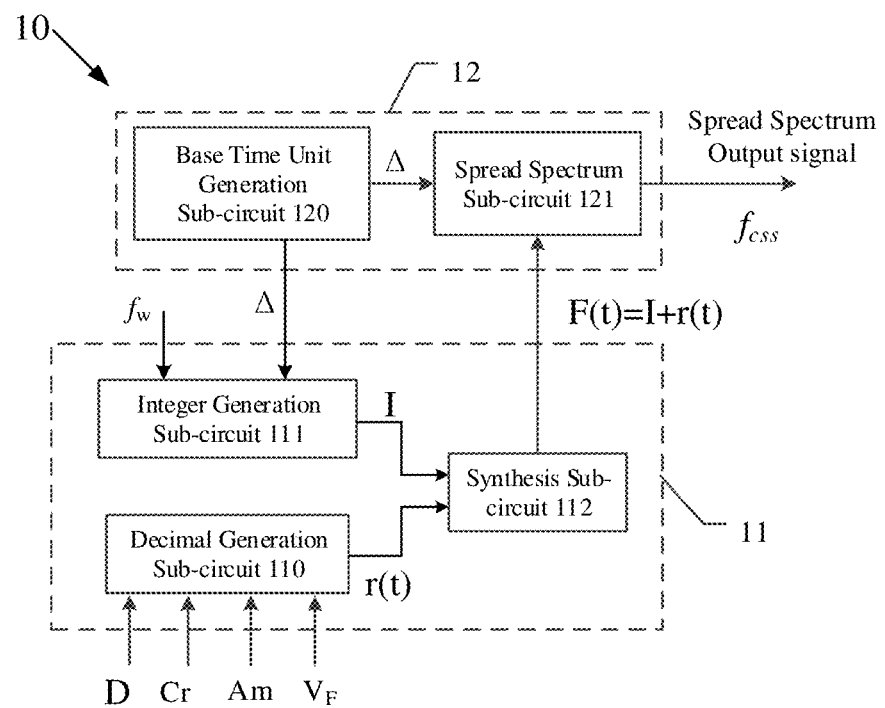
FIG. 2A is a schematic structural diagram of a clock spread spectrum circuit provided by some embodiments of the present disclosure.
Figure 2B:
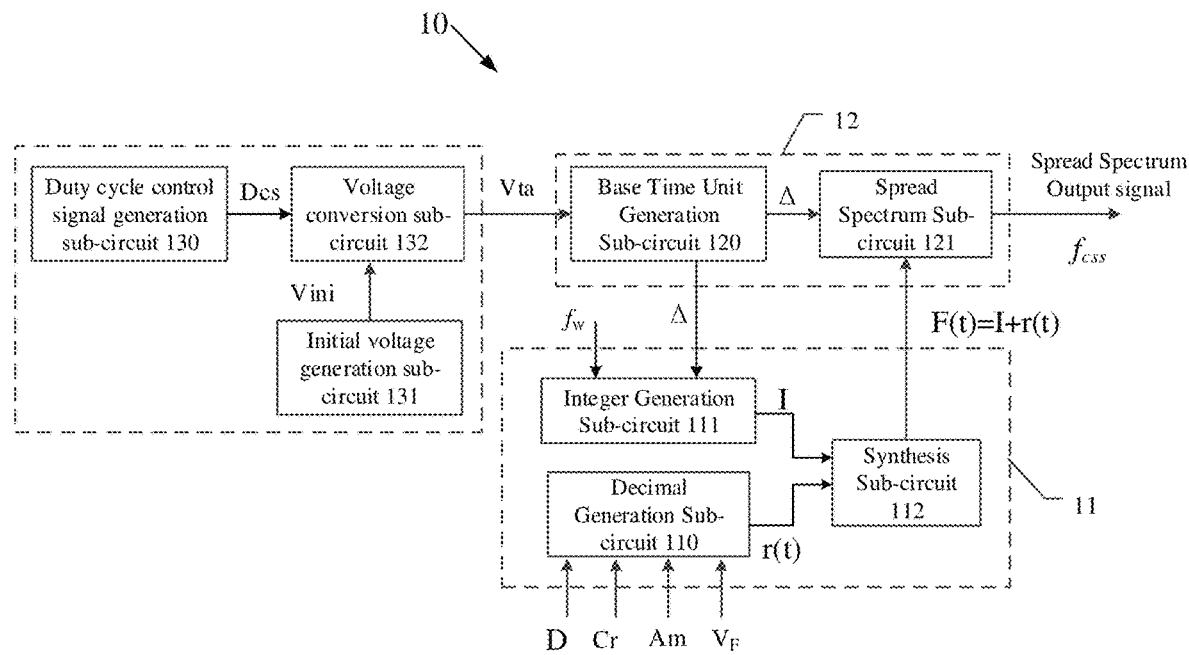
FIG. 2B is a schematic structural diagram of another clock spread spectrum circuit provided by some embodiments of the present disclosure.

FIG. 1A is a schematic block diagram of a clock spread spectrum circuit provided by some embodiments of the present disclosure, FIG. 1B is a schematic block diagram of another clock spread spectrum circuit provided by some embodiments of the present disclosure, FIG. 2A is a schematic structural diagram of a clock spread spectrum circuit provided by some embodiments of the present disclosure, and FIG. 2B is a schematic structural diagram of another clock spread spectrum circuit provided by some embodiments of the present disclosure.

The structural diagram shown in FIG. 2A is a structural diagram of the clock spread spectrum circuit shown in FIG. 1A, and the structural diagram shown in FIG. 2B is a structural diagram of the clock spread spectrum circuit shown in FIG. 1B.

For example, as illustrated in FIG. 1A, the clock spread spectrum circuit 10 may include a control circuit 11 and a signal generation circuit 12. The control circuit 11 is configured to generate a frequency control word according to a modulation parameter, and the signal generation circuit 12 is configured to receive the frequency control word and generate and output a spread spectrum output signal that is spectrum-spread according to the frequency control word.

For example, as shown in FIG. 1B, the clock spread spectrum circuit 10 may include a control circuit 11, a signal generation circuit 12, and a duty cycle adjustment circuit 13. The duty cycle adjustment circuit 13 is configured to generate a target voltage having a duty cycle that is equal to a target duty cycle; the control circuit 11 is configured to generate a frequency control word according to a modulation parameter, and the signal generation circuit 12 is configured to receive the target voltage and the frequency control word and generate and output a spread spectrum output signal that is spectrum-spread according to the target voltage and the frequency control word.

For example, the frequency control word changes discretely with time, and the spread spectrum output signal corresponds to the frequency control word.

It should be noted that, in the embodiments of the present disclosure, "the spread spectrum output signal corresponds to the frequency control word" means that the frequency of the spread spectrum output signal corresponds to the frequency control word, and the frequency of the spread spectrum output signal may be adjusted by the frequency control word. Because the frequency control word changes discretely with time, the frequency of the spread spectrum output signal also changes discretely with time, and the frequency spectrum of the spread spectrum output signal is a broadband spectrum, thereby achieving clock spread spectrum.

For example, in the embodiments shown in FIG. 1B, a duty cycle of the spread spectrum output signal is the target duty cycle. In the embodiment of the present disclosure, the duty cycle of the target voltage can determine the duty cycle of the spread spectrum output signal.

For example, the target duty cycle may represent the duty cycle that the user expects the spread spectrum output signal to have. The target duty cycle may be set according to actual requirements, and the present disclosure does not limit the specific value of the target duty cycle. For example, the target duty cycle can be ½, ⅓, or the like.

In the circuit system including the clock spread spectrum circuit provided by the embodiments of the present disclosure, the normal operation of the circuit system is not affected when the spread spectrum function is turned on and turned off, thereby ensuring the performance of the circuit system while achieving the purpose of reducing electromagnetic radiation.

For example, the frequency control word may be expressed as:

$$F(t)=I+r(t),$$

where F(t) is the frequency control word, I is an integer part of the frequency control word, r(t) is a decimal part of the frequency control word, r(t) changes discretely with time, and t represents the time. For example, the range of r(t) is [0,1), that is, r(t) varies from 0 to 1, and r(t) can be 0, but cannot be 1. Therefore, in some examples, in a case where the integer part I of the frequency control word is unchanged, the maximum value of the frequency control word and the minimum value of the frequency control word may satisfy the following formula: 0≤Fmax−Fmin<1, where Fmin represents the minimum value of the frequency control word, and Fmax represents the maximum value of the frequency control word.

It should be noted that although r(t) cannot be 1, the integer part I of the frequency control word can change. In this case, the maximum value Fmax of the frequency control word and the minimum value Fmin of the frequency control word can satisfy the following formula: 0≤Fmax−Fmin≤1. For example, in other examples, Fmin=I+r(t), Fmax=(I+1)+r(t), r(t) can be set to 0, and therefore, Fmax−Fmin=1. In this case, the frequency control word F(t) still oscillates between two integers.

For example, in some embodiments, as shown in FIG. 2B, the duty cycle adjustment circuit 13 includes a duty cycle control signal generation sub-circuit 130, an initial voltage generation sub-circuit 131, and a voltage conversion sub-circuit 132.

For example, as shown in FIG. 2B, the duty cycle control signal generation sub-circuit 130 is configured to generate a duty cycle control signal Dcs having a duty cycle that is equal to the target duty cycle, the initial voltage generation sub-circuit 131 is configured to generate an initial voltage Vini, and the voltage conversion sub-circuit 132 is configured to convert the initial voltage Vini based on the duty cycle control signal Dcs to obtain the target voltage Vta.

For example, in some embodiments, the initial voltage generation sub-circuit 131 may be a signal generator capable of outputting a fixed voltage signal.

Figure 3:
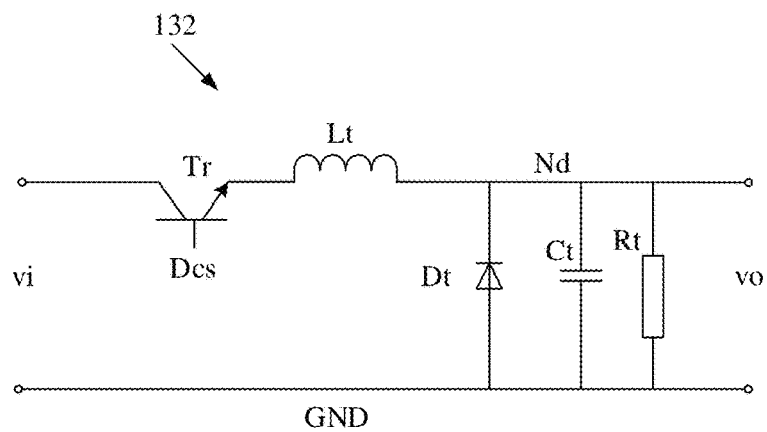
FIG. 3 is a schematic diagram of a voltage conversion sub-circuit provided by at least one embodiment of the present disclosure.

FIG. 3 is a schematic diagram of a voltage conversion sub-circuit provided by at least one embodiment of the present disclosure.

For example, as shown in FIG. 3, the input vi of the voltage conversion sub-circuit 132 is the initial voltage Vini, and the output vo of the voltage conversion sub-circuit 132 is the target voltage Vta. The target voltage Vta is expressed as: Vta=Vini×μ, where μ represents the voltage conversion efficiency of the voltage conversion sub-circuit 132. It can be seen that the target voltage Vta is positively correlated with the initial voltage Vini, the larger the initial voltage Vini, the larger the target voltage Vta; the smaller the initial voltage Vini, the smaller the target voltage Vta. The target voltage Vta is also positively correlated with the voltage conversion efficiency of the voltage conversion sub-circuit 132, that is, the larger the voltage conversion efficiency, the larger the target voltage Vta, and the smaller the voltage conversion efficiency, the smaller the target voltage Vta.

For example, the duty cycle of the target voltage Vta is determined by the duty cycle control signal Dcs, the duty cycle of the target voltage Vta is the same as the duty cycle of the duty cycle control signal Dcs, the duty cycle of the duty cycle control signal Dcs is the target duty cycle, and thus the duty cycle of the target voltage Vta is the target duty cycle.

For example, the voltage conversion sub-circuit 132 may be implemented by hardware elements. As shown in FIG. 3, in some embodiments, the voltage conversion sub-circuit 132 may include a triode Tr, an inductor Lt, a resistor Rt, a capacitor Ct, and a diode Dt. The triode Tr may be an NPN type triode. The collector of the triode Tr receives the initial voltage Vini, the base of the triode Tr receives the duty cycle control signal Dcs, the emitter of the triode Tr is connected to one end of the inductor Lt, the other end of the inductor Lt is connected to the node Nd, the negative electrode of the diode Dt is connected to the node Nd, the positive electrode of the diode Dt is connected to the ground terminal GND, the two ends of the capacitor Ct are respectively connected to the node Nd and the ground terminal GND, and the two ends of the resistor Rt are respectively connected to the node Nd and the ground terminal GND.

Figure 4A:
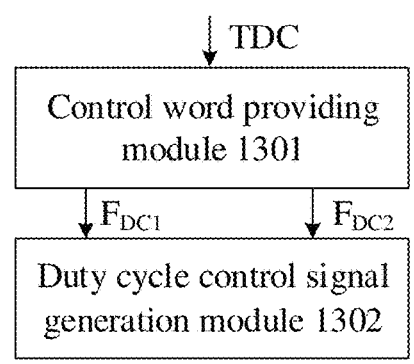
FIG. 4A is a schematic structural diagram of a duty cycle control signal generation sub-circuit according to at least one embodiment of the present disclosure.

FIG. 4A is a schematic structural diagram of a duty cycle control signal generation sub-circuit according to at least one embodiment of the present disclosure.

For example, as shown in FIG. 4A, the duty cycle control signal generation sub-circuit 130 comprises: a control word providing module 1301 and a duty cycle control signal generation module 1302, the control word providing module 1301 is connected to the duty cycle control signal generation module 1302.

For example, as shown in FIG. 4A, the control word providing module 1301 is configured to obtain the target duty cycle TDC, generate a first duty cycle control word $F_{DC1}$ and a second duty cycle control word $F_{DC2}$ based on the target duty cycle TDC, and output the first duty cycle control word $F_{DC1}$ and the second duty cycle control word $F_{DC2}$ to the duty cycle control signal generation module 1302.

For example, a ratio of the first duty cycle control word $F_{DC1}$ and the second duty cycle control word $F_{DC2}$ may be equal to the target duty cycle, that is, the first duty cycle control word $F_{DC1}$ and the second duty cycle control word $F_{DC2}$ may satisfy: TDC=$F_{DC1}$/$F_{DC2}$.

For example, the duty cycle control signal generation module 1302 is configured to, in response to the first duty cycle control word $F_{DC1}$ and the second duty cycle control word $F_{DC2}$, generate the duty cycle control signal Dcs.

For example, the first duty cycle control word $F_{DC1}$ and the second duty cycle control word $F_{DC2}$ may both be positive integers, that is, do not include a fractional part.

In the embodiment of the present disclosure, the duty cycle control signal generation sub-circuit 130 may flexibly generate the first duty cycle control word $F_{DC1}$ and the second duty cycle control word $F_{DC2}$ based on the desired target duty cycle, and may generate the duty cycle control signal having the target duty cycle based on the first duty cycle control word $F_{DC1}$ and the second duty cycle control word $F_{DC2}$. The duty cycle control signal generation sub-circuit 130 has better flexibility and reliability in generating the duty cycle control signal, and accordingly, the high-performance electronic equipment configured with the duty cycle control signal generation sub-circuit 130 has efficient work guarantee.

For example, the target duty cycle TDC obtained by the control word providing module 1301 may be the duty cycle input by the user, and the target duty cycle TDC may be less than 1, that is, the relationship between the first duty cycle control word $F_{DC1}$ and the second duty cycle control word $F_{DC2}$ may satisfy: $1 \leq F_{DC1} < F_{DC2}$. Of course, the target duty cycle TDC may also be equal to 1, that is, the first duty cycle control word $F_{DC1}$ and the second duty cycle control word $F_{DC2}$ may also be equal.

Figure 4B:
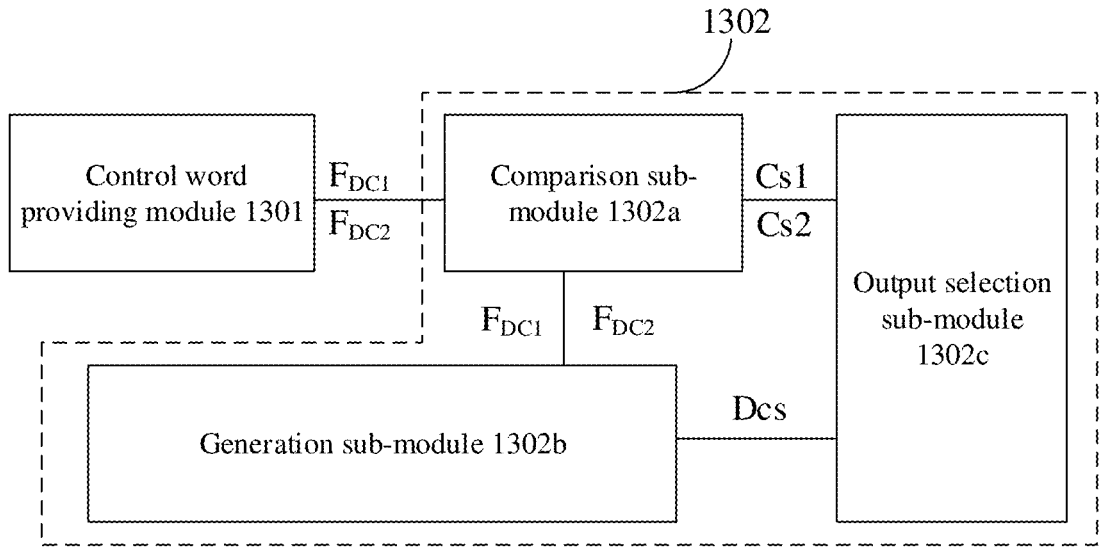
FIG. 4B is a schematic structural diagram of another duty cycle control signal generation sub-circuit provided by at least one embodiment of the present disclosure.

FIG. 4B is a schematic structural diagram of another duty cycle control signal generation sub-circuit provided by at least one embodiment of the present disclosure.

For example, as shown in FIG. 4B, the duty cycle control signal generation module 1302 may comprise a comparison sub-module 1302a, a generation sub-module 1302b, and an output selection sub-module 1302c.

The comparison sub-module 1302a is connected to the control word providing module 1301, the generation sub-module 1302b, and the output selection sub-module 1302c. The control word providing module 1301 is configured to output the first duty cycle control word $F_{DC1}$ and the second duty cycle control word $F_{DC2}$ to the comparison sub-module 1302a; that is, the comparison sub-module 1302a may be configured to receive the first duty cycle control word $F_{DC1}$ and the second duty cycle control word $F_{DC2}$.

For example, as shown in FIG. 4B, the comparison sub-module 1302a is configured to judge whether the first duty cycle control word $F_{DC1}$ and the second duty cycle control word $F_{DC2}$ are equal or not, output the first duty cycle control word $F_{DC1}$ and the second duty cycle control word $F_{DC2}$ to the generation sub-module 1302b and output a first control signal Cs1 to the output selection sub-module 1302c if the first duty cycle control word $F_{DC1}$ and the second duty cycle control word $F_{DC2}$ are not equal (namely $F_{DC1} \neq F_{DC2}$); and output a second control signal Cs2 to the output selection sub-module 1302c if the first duty cycle control word $F_{DC1}$ and the second duty cycle control word $F_{DC2}$ are equal (namely $F_{DC1} = F_{DC2}$).

For example, in some embodiments, the comparison sub-module 1302a may include a comparator. After receiving the first duty cycle control word $F_{DC1}$ and the second duty cycle control word $F_{DC2}$, the comparator can determine whether the first duty cycle control word $F_{DC1}$ and the second duty cycle control word $F_{DC2}$ are equal by comparing the first duty cycle control word $F_{DC1}$ and the second duty cycle control word $F_{DC2}$.

For example, as shown in FIG. 4B, the generation sub-module 1302b is connected to the output selection sub-module 1302c, the generation sub-module 1302b is configured to generate the duty cycle control signal Dcs and output the duty cycle control signal Dcs to the output selection sub-module 1302c in response to receiving the first duty cycle control word $F_{DC1}$ and the second duty cycle control word $F_{DC2}$.

For example, as shown in FIG. 4B, the output selection sub-module 1302c is configured to output the duty cycle control signal Dcs generated by the generation sub-module 1302b in response to receiving the first control signal Cs1, and output a default control signal having a duty cycle that is equal to 1 as the duty cycle control signal in response to receiving the second control signal Cs2. When the target duty cycle TDC is not equal to 1, the generation sub-module 1302b generates the duty cycle control signal Dcs and the output selection sub-module 1302c outputs the duty cycle control signal Dcs generated by the generation sub-module 1302b.

When the target duty cycle TDC is equal to 1, the output selection sub-module 1302c outputs the default control signal having a duty cycle equal to 1 (i.e., a signal without a falling edge), in this case, the duty cycle of the default control signal is the same as the target duty cycle. In the case where the first duty cycle control word $F_{DC1}$ and the second duty cycle control word $F_{DC2}$ are equal, the generation sub-module 1302b does not need to generate the duty cycle control signal, and the output selection sub-module 1302c can directly output the default control signal as the duty cycle control signal, thereby saving power consumption.

For example, in some embodiments, the output selection sub-module 1302c may be a multiplexer (MUX).

Figure 4C:
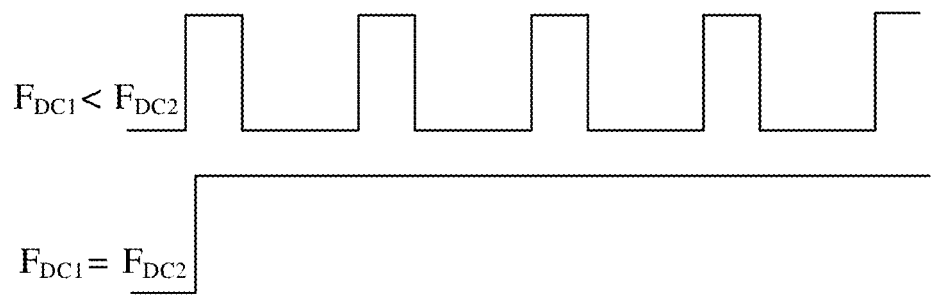
FIG. 4C is a schematic diagram of two duty cycle control signals provided by at least one embodiment of the present disclosure.

FIG. 4C is a schematic diagram of two duty cycle control signals provided by at least one embodiment of the present disclosure. One of the two duty cycle control signals corresponds a target duty cycle TDC equal to 1 (i.e., $F_{DC1} = F_{DC2}$), and the other of the two duty cycle control signals corresponds a target duty cycle TDC less than 1 (i.e., $F_{DC1} < F_{DC2}$).

It should be noted that, in order to drive the duty cycle control signal generation sub-circuit to work normally, the duty cycle control signal generation sub-circuit may further include a power supply module for supplying power to respective modules included in the duty cycle control signal generation sub-circuit, and the power supply module can be connected with a DC power supply terminal capable of providing a power signal. For example, the default control signal with a duty cycle of 1 output by the output selection sub-module 1302c may be a DC power supply signal output from the DC power supply terminal.

Because when the target duty cycle TDC is 1, the duty cycle control signal does not need to be generated based on the first duty cycle control word $F_{DC1}$ and the second duty cycle control word $F_{DC2}$, the comparison sub-module 1302a can output, based on the target duty cycle TDC, a control signal to the output selection sub-module 1302c, to control the output selection sub-module 1302c to output the duty cycle control signal generated by the output generation sub-module 1302b or directly output the default control signal. On the premise of ensuring that the duty cycle control signal can be reliably output based on the target duty cycle TDC, the power consumption of the generation sub-module 1302b is effectively reduced, that is, the power consumption of the duty cycle control signal generation module 1302 is reduced.

Figure 4D:
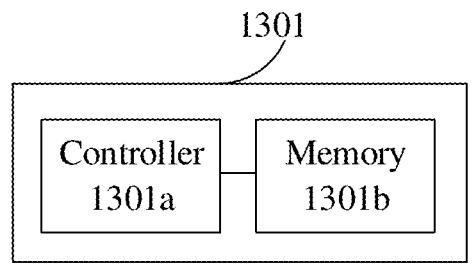
FIG. 4D is a schematic structural diagram of a control word providing module according to at least one embodiment of the present disclosure.

FIG. 4D is a schematic structural diagram of a control word providing module according to at least one embodiment of the present disclosure.

For example, as shown in FIG. 4D, the control word providing module 1301 comprises: a controller 1301a and a memory 1301b.

For example, the memory 1301b stores a plurality of duty cycle control word pairs, each of the plurality of duty cycle control word pairs comprises a first candidate duty cycle control word and a second candidate duty cycle control word, a plurality of candidate ratios (duty cycles) corresponding to the plurality of duty cycle control word pairs are different from each other, a candidate ratio corresponding to a duty cycle control word pair represents a ratio of a first candidate duty cycle control word and a second candidate duty cycle control word comprised in the duty cycle control word pair, for example, if the first candidate duty cycle control word is denoted as Fcd1, the second candidate duty cycle control word is denoted as Fcd2, the ratio can be: Fcd1/Fcd2.

For example, the first candidate duty cycle control word and the second candidate duty cycle control word included in each duty cycle control word pair may both be positive integers.

For example, the controller 1301a may be connected to the memory 1301b, the controller 1301a is configured to determine a target duty cycle control word pair from the plurality of duty cycle control word pairs based on the target duty cycle TDC. For example, a ratio of a first candidate duty cycle control word and a second candidate duty cycle control word comprised in the target duty cycle control word pair is equal to the target duty cycle TDC.

For example, the controller 1301a is further configured to determine the first candidate duty cycle control word comprised in the target duty cycle control word pair as the first duty cycle control word $F_{DC1}$, and determine the second candidate duty cycle control word comprised in the target duty cycle control word pair as the second duty cycle control word $F_{DC2}$.

For example, in some embodiments, the controller 1301a may traverse the plurality of duty cycle control word pairs stored in the memory 1301b to determine the target duty cycle control word pair, to which the ratio corresponds is the target duty cycle TDC.

Figure 4E:
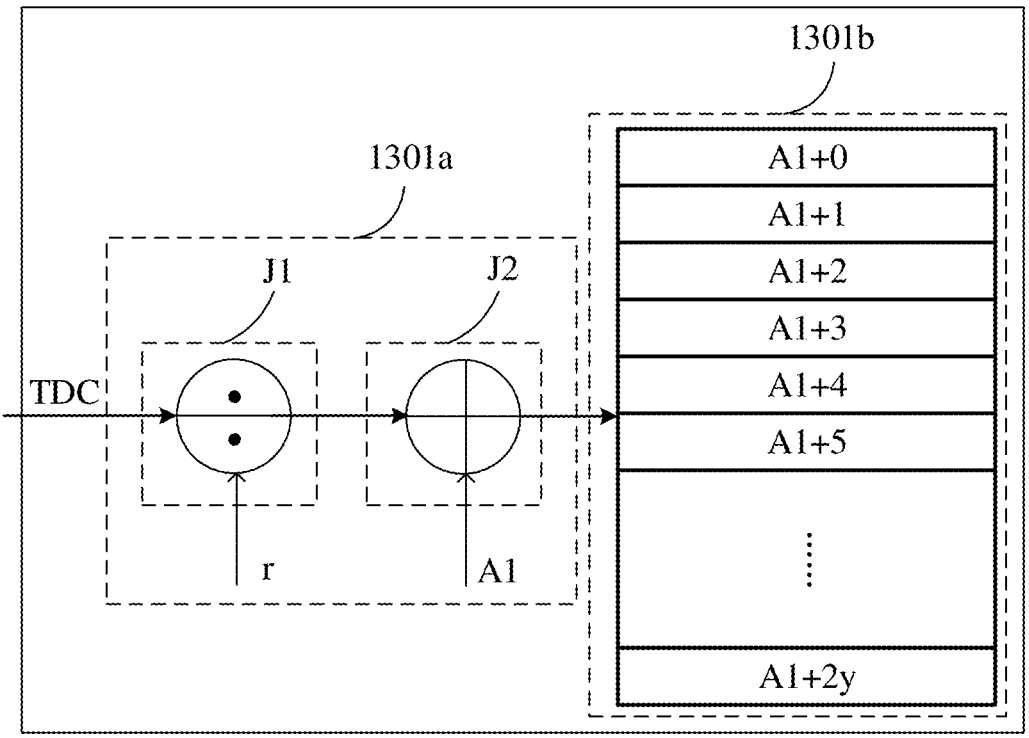
FIG. 4E is a schematic structural diagram of another control word providing module provided by at least one embodiment of the present disclosure.

FIG. 4E is a schematic structural diagram of another control word providing module provided by at least one embodiment of the present disclosure.

For example, in other embodiments, as shown in FIG. 4E, the memory 1301b may have a plurality of storage areas, and each of the storage areas stores one duty cycle control word pair, the duty cycle control word pairs stored in the plurality of storage areas are different, that is, the ratios obtained based on the duty cycle control word pairs stored in the plurality of storage areas are different.

For example, as shown in FIG. 4E, in some embodiments, the memory 1301b has (2y+1) storage areas, i.e., 2y storage bytes. The addresses of the (2y+1) storage areas may be respectively: A1+0 to A1+2y, and A1 is a base address. For example, the base address A1 may also be a start address pre-allocated to a first storage area among the plurality of storage areas.

For example, the controller 1301a is configured to determine an address of a target storage area from the plurality of storage areas based on the target duty cycle TDC, and acquire the target duty cycle control word pair from the target storage area based on the address of the target storage area. That is, the controller 1301a can first determine the address of the target storage area storing the target duty cycle control word pair based on the target duty cycle TDC, and then directly read the target duty cycle control word pair from the target storage area as the first duty cycle control word $F_{DC1}$ and the second duty cycle control word $F_{DC2}$.

For example, in some embodiments, the address A of the target storage area may satisfy: A=A1+TDC/r, A1 is the base address, TDC is the target duty cycle, r is the resolution of the target duty cycle.

The resolution of the target duty cycle refers to the minimum value that the duty cycle of the target voltage generated by the duty cycle adjustment circuit can reach, and r can be the minimum value of the resolution of the target duty cycle, and the r can be pre-stored in the control word providing module 1301.

In order to calculate to obtain the address of the target storage area based on the formula A=A1+TDC/r, for example, referring to FIG. 4E, the controller 1301a may include a divider J1 and an adder J2, and after obtaining the target duty cycle TDC, the controller 1301a can calculate the ratio TDC/r of the target duty cycle TDC and the resolution r through the divider J1, and calculate the sum of the base address A1 and the ratio TDC/r through the adder J2, thereby obtaining the address of the target storage area where the target duty cycle control word pair is stored, and the controller 1301a can read the target duty cycle control word pair stored in the target storage area based on the address of the target storage area to obtain the first duty cycle control word $F_{DC1}$ and the second duty cycle control word $F_{DC2}$. In this way, the reliability and efficiency of determining the first duty cycle control word $F_{DC1}$ and the second duty cycle control word $F_{DC2}$ can be improved.

It should be noted that, if the memory 1301b does not store the first candidate duty cycle control word and the second candidate duty cycle control word, the ratio of which is the target duty cycle TDC, the controller 1301a can output a first default duty cycle control word and a second default duty cycle control word to the duty cycle control signal generation module 1302, and then the duty cycle control signal generation module 1302 generates and outputs the duty cycle control signal based on the first default duty cycle control word and the second default duty cycle control word. For example, the first default duty cycle control word and the second default duty cycle control word may be pre-stored in the control word providing module 1301 (e.g., the controller 1301a). The control word providing module 1301 can also issue an alarm prompt when the first duty cycle control word $F_{DC1}$ and the second duty cycle control word $F_{DC2}$ corresponding to the target duty cycle cannot be obtained, so as to prompt the user to check the target duty cycle TDC. For example, the control word providing module 1301 may further include a buzzer, and the alarm prompt may be a sound alarm prompt issued by the buzzer.

Because the control word providing module 1301 searches based on the target duty cycle TDC to determine the first duty cycle control word $F_{DC1}$ and the second duty cycle control word $F_{DC2}$, the control word providing module 1301 can also be referred to as a duty cycle control word lookup table (DF lookup table), and the DF lookup table may be the memory and the controller shown in FIG. 4E, or the DF lookup table may also be a decoder. Certainly, the determination of the first duty cycle control word $F_{DC1}$ and the second duty cycle control word $F_{DC2}$ is not limited to the two implementation methods described in the above embodiments. For example, the control word providing module 1301 may have a built-in algorithm for calculating the duty cycle control word based on the target duty cycle.

After obtaining the target duty cycle, the control word providing module 1301 may directly substitute the target duty cycle into the algorithm to calculate the corresponding first duty cycle control word $F_{DC1}$ and the corresponding second duty cycle control word $F_{DC2}$.

It should be noted that the control word providing module 1301, the comparison sub-module 1302a, and the output selection sub-module 1302c may be composed of hardware, that is, may be hardware circuits; or, may be virtual circuits (e.g., a processing chip) configured with a code program. The embodiments of the present disclosure do not limit this. For the control word providing module 1301, in the case where the control word providing module 1301 is a virtual circuit configured with a code program, if the control word providing module 1301 cannot find out the first duty cycle control word $F_{DC1}$ and the second duty cycle control word $F_{DC2}$, the ratio of which is the target duty cycle TDC, the control word providing module 1301 can invoke a default program, and the default program can be pre-stored in the control word providing module 1301.

Figure 4F:
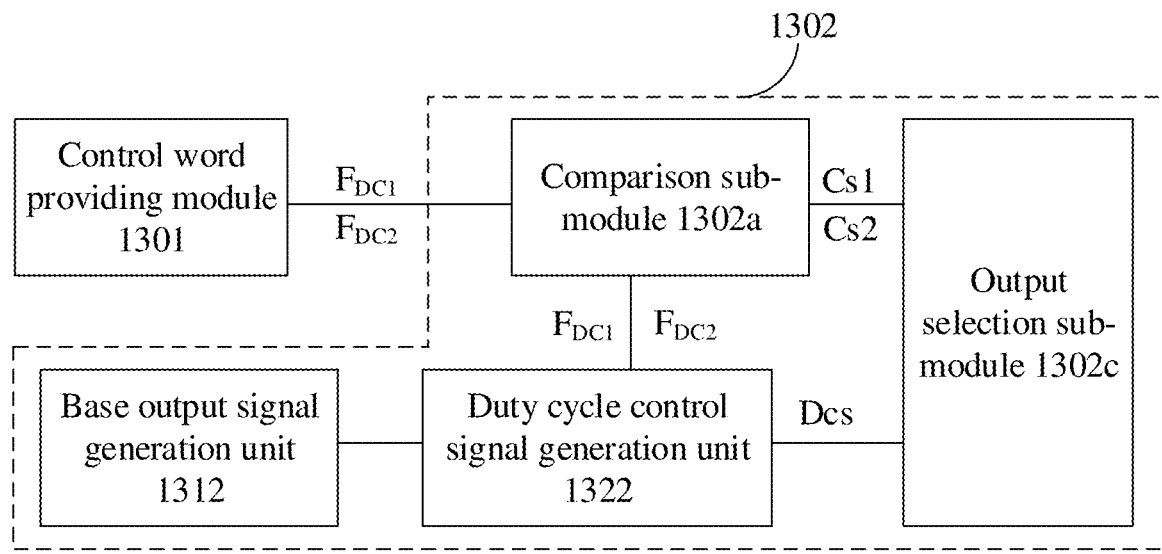
FIG. 4F is a schematic structural diagram of yet another duty cycle control signal generation sub-circuit provided by at least one embodiment of the present disclosure.

FIG. 4F is a schematic structural diagram of yet another duty cycle control signal generation sub-circuit provided by at least one embodiment of the present disclosure.

For example, as shown in FIG. 4F, the generation sub-module 1302b may comprise: a base output signal generation unit 1312 and a duty cycle control signal generation unit 1322, and the base output signal generation unit 1312 is connected to the duty cycle control signal generation unit 1322.

For example, the base output signal generation unit 1312 is configured to generate a plurality of first base output signals with phases evenly spaced and output the plurality of first base output signals to the duty cycle control signal generation unit 1322. For example, the periods of the plurality of first base output signals are the same, the phases of the plurality of first base output signals are also the same, and a phase difference or a time interval Δd between any two adjacent first base output signals is equal to a fixed value.

Figure 4G:
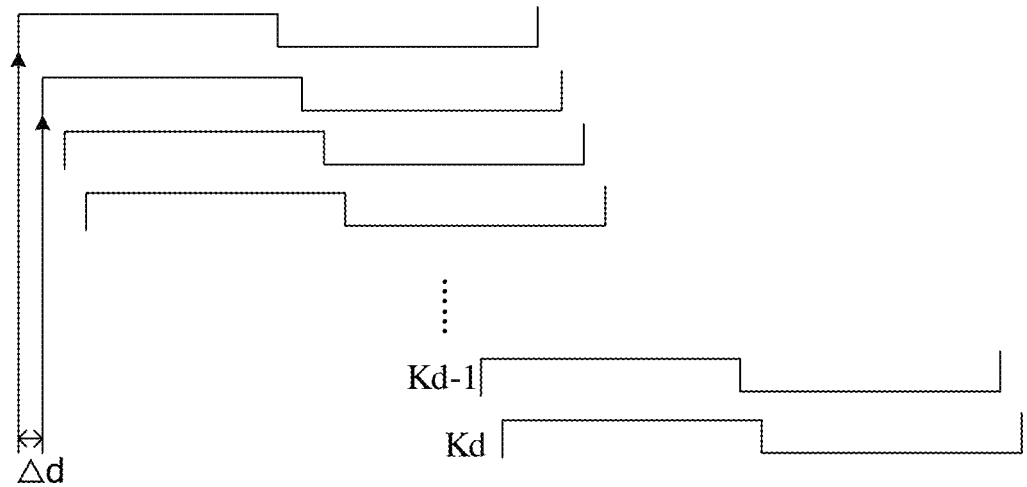
FIG. 4G shows a schematic diagram of Kd first base output signals with phases evenly spaced provided by some embodiments of the present disclosure.

Taking a case of generating Kd first base output signals by the base output signal generation unit 1312 as an example, FIG. 4G shows the Kd first base output signals.

For example, as shown in FIG. 4G, the phase difference Δd between every two adjacent first base output signals can satisfy: Δd=T1/Kd=1/Kd*f1, where Kd is the number of the plurality of first base output signals, T1 is the period of each first base output signal, and f1 is the frequency of each first base output signal.

It should be noted that the resolution r of the target duty cycle can satisfy: $r=1/F_{DC2} \geq 1/(\max F_{DC2})=\frac{1}{2}*Kd$); it can be seen from this formula that each second duty cycle control word $F_{DC2}$ corresponds to a resolution r, and the minimum value of the pre-stored r can be 1/(2*Kd). The larger the Kd, the smaller the r, and the better the resolution (that is, the minimum value that the target duty cycle can achieve is smaller). For example, if Kd is 256, the resolution r of the target duty cycle D can reach 0.195%.

For example, the number Kd of the plurality of first base output signals that can be generated by the base output signal generation unit 1312 may be preconfigured in the base output signal generation unit 1312, for example, Kd may be set in the base output signal generation unit 1312 by a user (e.g., a developer). Kd may be $2^i$, and i may be an integer greater than or equal to 1. For example, Kd can be 16, 32, 128, or other values.

For example, the duty cycle control signal generation unit 1322 may also be connected to the comparison sub-module 1302a and the output selection sub-module 1302c, respectively. The duty cycle control signal generation unit 1322 is configured to generate the duty cycle control word Dcs based on the plurality of first base output signals, and the first duty cycle control word $F_{DC1}$ and the second duty cycle control word $F_{DC2}$ output by the comparison sub-module 1302a, and output the duty cycle control signal Dcs to the output selection sub-module 1302c.

Figure 4H:
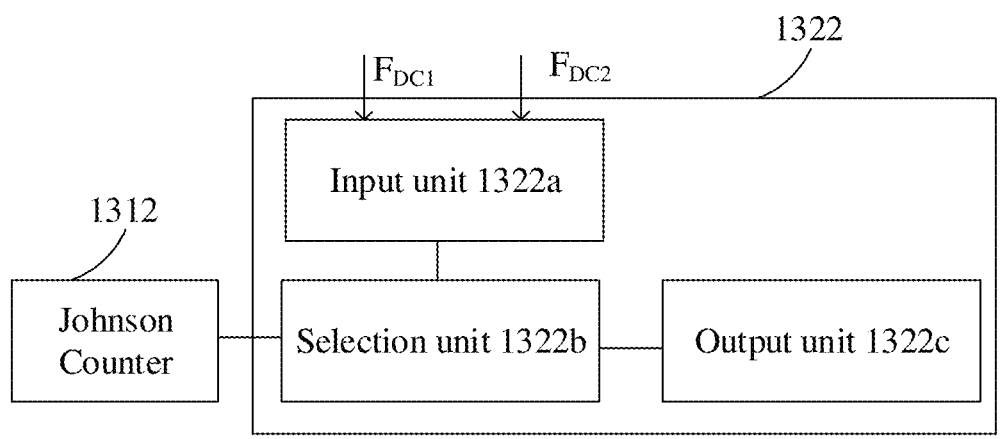
FIG. 4H is a schematic structural diagram of a generation sub-module provided by at least one embodiment of the present disclosure.

FIG. 4H is a schematic structural diagram of a generation sub-module provided by at least one embodiment of the present disclosure.

As shown in FIG. 4H, the base output signal generation unit 1312 may include a Johnson Counter. Because the number of the first base output signals that can be generated by the John counter is relatively large, that is, Kd can be made larger, so that a better resolution of the target duty cycle can be achieved, and the applicability is stronger.

As shown in FIG. 4H, the duty cycle control signal generation unit 1322 may include: an input unit 1322a, a selection unit 1322b, and an output unit 1322c.

For example, the input unit 1322a is connected to the control word providing module 1301 and the selection unit 1322b, and the input unit 1322a is configured to output a selection control signal to the selection unit 1322b based on the first duty cycle control word $F_{DC1}$ and the second duty cycle control word $F_{DC2}$.

The selection unit 1322b is also connected to the base output signal generation unit 1312 and the output unit 1322c, the selection unit 1322b is configured to select a first base output signal from the plurality of first base output signals as a target first base output signal in response to the selection control signal and output the target first base output signal to the output unit 1322c.

The output unit 1322c is also connected to the output selection sub-module 1302c, and the output unit 1322c is configured to generate the duty cycle control signal Dcs based on the target first base output signal, and output the duty cycle control signal Dcs to the output selection sub-module 1302c.

For example, the duty cycle of the duty cycle control signal Dcs is the target duty cycle, that is, $F_{DC1}/F_{DC2}$.

Figure 4I:
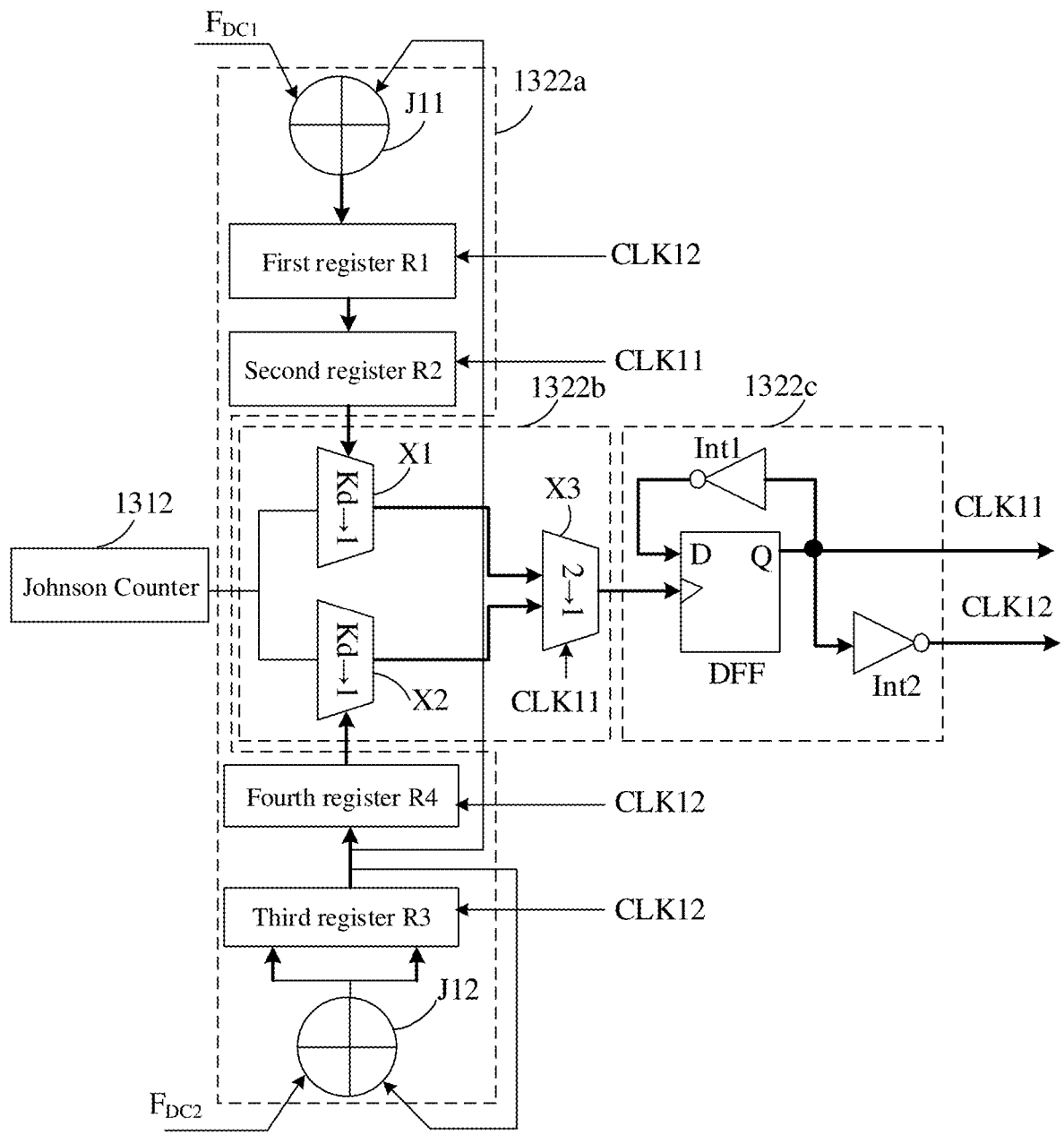
FIG. 4I is a schematic structural diagram of another generation sub-module provided by an embodiment of the present disclosure.

FIG. 4I is a schematic structural diagram of another generation sub-module provided by an embodiment of the present disclosure.

For example, the generation sub-module 1302b may include a TAF-DPS synthesizer. The circuit structure of the generation sub-module based on the TAF-DPS synthesizer will be described with reference to FIG. 4I below.

As shown in FIG. 4I, the input unit 1322a may include: a first register R1, a second register R2, a third register R3, a fourth register R4, a first adder J11, and a second adder J12. The selection unit 1322b may comprise a first selector X1, a second selector X2, and a third selector X3. The output unit 1322c may comprise a D flip-flop DFF, a first inverter Int1, and a second inverter Int2.

For example, as shown in FIG. 4I, the first adder J11 and the second adder J12 both may be connected to the control word providing module 1301 (not shown in FIG. 4I); the first adder J11, the first register R1, the second register R2, and the first selector X1 are connected in sequence; and the second adder J12, the third register R3, the fourth register R4, and the second selector X2 are connected in sequence. The second register R2 is also connected to a first clock signal terminal CLK11; the first register R1, the third register R3, and the fourth register R4 are also connected to a second clock signal terminal CLK12.

For example, as shown in FIG. 4I, the first selector X1 and the second selector X2 also may be connected to the base output signal generation unit 1312 and the third selector X3, and the third selector X3 is also connected to a first input end of the D flip-flop DFF and the first clock signal terminal CLK11. A second input end of the D flip-flop DFF is connected to an output end of the first inverter Int1, an input end of the first inverter Int1 and an input end of the second inverter Int2 are both connected to an output end of the D flip-flop DFF.

Referring to FIG. 4I, the output end of the D flip-flop DFF can be used as the first clock signal terminal CLK11, the output end of the second inverter Int2 can be used as the second clock signal terminal CLK12, and the first clock signal provided by the first clock signal terminal CLK11 and the second clock signal provided by the second clock signal terminal CLK12 have opposite phases and the same frequency.

For example, as shown in FIG. 4G and FIG. 4I, in the case where the base output signal generation unit 1312 generates Kd first base output signals, the first selector X1 and the second selector X2 both may be Kd→1 multiplexers as shown in FIG. 4I (that is, selecting one first base output signal from the Kd first base output signals). The third selector X3 can be a 2→1 multiplexer (i.e., select 1 signal from 2 signals).

For example, as shown in FIG. 4I, the first adder J11 may be configured to add the first duty cycle control word $F_{DC1}$ and information stored in the third register R3 to obtain a first addition result, and store the first addition result in the first register R1 at a first rising edge of a second clock signal provided by the second clock signal terminal CLK12 connected to the first register R1, the second register R2 is configured to store the first addition result stored in the first register R1 at a first rising edge of a first clock signal provided by the first clock signal terminal CLK11 connected to the second register R2, and output the first addition result to the first selector X1. That is, at the first rising edge of the first clock signal provided by the first clock signal terminal CLK11 connected to the second register R2, the first addition result stored in the first register R1 will be stored in the second register R2 and used as a selection signal of the first selector X1. For example, in some examples, at the first rising edge of the first clock signal provided by the first clock signal terminal CLK11 connected to the second register R2, the most significant bit stored in the first register R1 will be stored in the second register R2 and used as a selection signal of the first selector X1.

Correspondingly, the first selector X1 is configured to select a first base output signal from the plurality of first base output signals as a first selected first base output signal in response to the first addition result output by the second register R2, and output the first selected first base output signal to the third selector X3; the first selector X1 may select a first base output signal from the plurality of first base output signals as an output signal of the first selector X1 in response to the selection signal (that is, first addition result), that is, the output signal of the first selector X1 is the first selected first base output signal, and then the first selector X1 outputs the first selected first base output signal to the third selector X3.

Similarly, the second adder J12 is configured to add the second duty cycle control word $F_{DC2}$ and the information stored in the third register R3 to obtain a second addition result, and store the second addition result in the third register R3 at a second rising edge of the second clock signal provided by the second clock signal terminal CLK12 connected to the third register R3, the fourth register R4 is configured to store the second addition result stored in the third register R3 at a third rising edge (for example, the second rising edge and the third rising edge are two adjacent rising edges) of the second clock signal provided by the second clock signal terminal CLK12 connected to the fourth register R4, and output the second addition result to the second selector X2. That is, at the third rising edge of the second clock signal provided at the second clock signal terminal CLK2 connected to the fourth register R4, the second addition result stored in the third register R3 is stored in the fourth register R4 and used as a selection signal of the second selector X2. For example, in some examples, at the third rising edge of the second clock signal provided at the second clock signal terminal CLK2 connected to the fourth register R4, the most significant bit stored in the third register R3 is stored in the fourth register R4 and used as a selection signal of the second selector X2.

For example, the second rising edge of the second clock signal may be the same as the first rising edge of the second clock signal, and may also different from the first rising edge of the second clock signal. Similarly, the third rising edge of the second clock signal may be the same as the first rising edge of the second clock signal, and may also different from the first rising edge of the second clock signal.

Correspondingly, the second selector X2 is configured to select a first base output signal from the plurality of first base output signals as a second selected first base output signal in response to the second addition result output by the fourth register R4, and output the second selected first base output signal to the third selector X3; the second selector X2 may select one first base output signal from the k first base output signals in response to the selection signal (that is, the second addition result) as an output signal of the second selector X2, that is, the output signal of the second selector X2 is the second selected first base output signal, and then the second selector X2 outputs the second selected first base output signal to the third selector X3.

For example, the information stored in the third register R3 may be the most significant bits (for example, 5 bits) or all information stored in the third register R3.

For example, the third selector X3 is configured to select one of the first selected first base output signal and the second selected first base output signal as the target first base output signal at a second rising edge of the first clock signal provided by the first clock signal terminal CLK11, and output the target first base output signal to the D flip-flop DFF. The target first base output signal is used as an input clock signal of the D flip-flop DFF. Then, the D flip-flop DFF is configured to generate the duty cycle control signal Dcs based on the target first base output signal and output the duty cycle control signal Dcs to the output selection sub-module 1302c. For example, the clock signal output by the output end of the D flip-flop DFF or the output end of the second inverter Int2 can be used as the final output signal, that is, the duty cycle control signal Dcs. Thus, the generation of the duty cycle control signal Dcs is implemented.

For example, the first rising edge of the first clock signal may be the same as the second rising edge of the first clock signal, and may also be different from the second rising edge of the first clock signal.

For example, the selection control signal output by the input unit 1322a comprises the first addition result and the second addition result.

For example, the selection signal (the second addition result) output by the fourth register R4 can be used as a falling edge selection signal, the selection signal (the first addition result) output by the second register R2 can be used as a rising edge selection signal, and the signals fed back by the third register R3 to the first adder J11 and the second adder J12 can be used to control the period switching of the generated signal. Correspondingly, the selection signal output by the fourth register R4 may be called the falling edge control word, and the selection signal output by the second register R2 may be called the rising edge control word. That is, the first duty cycle control word $F_{DC1}$ can be called the rising edge control word, the second duty cycle control word $F_{DC2}$ can be called the falling edge control word, and $F_{DC1}$ is used to control the duration of the high level in the duty cycle control signal, and $F_{DC2}-F_{DC1}$ is used to control the duration of the low level in the duty cycle control signal.

It should be noted that when generating the duty cycle control signal, only the pulse direct synthesis principle of the TAF-DPS circuit can be used and the time-average frequency principle is not used (that is, the signal output by the TAF-DPS circuit is controlled to only include one cycle).

For example, the period Tc of the duty cycle control signal Dcs finally output by the generation sub-module 1302b may satisfy: Tc=$F_{DC2}$*Δd=($F_{DC2}$*T1)/Kd=$F_{DC2}$/Kd*f1, where 2≤$F_{DC2}$≤2Kd, T1 is the period of each first base output signal, and f1 is the frequency of each first base output signal.

Figure 4J:
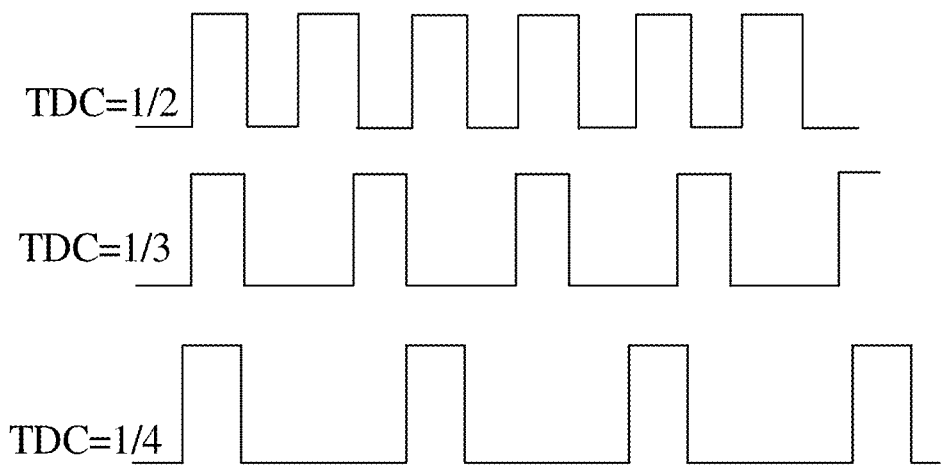
FIG. 4J is a schematic diagram of three duty cycle control signals corresponding to different target duty cycles provided by at least one embodiment of the present disclosure.

FIG. 4J shows a schematic diagram of three duty cycle control signals provided by the embodiment of the present disclosure. The three duty cycle control signals correspond three target duty cycles, and the three target duty cycles are TDC=½, TDC=⅓, and TDC=¼, respectively.

For example, changing the duty cycle of the duty cycle control signal can be achieved by changing the first duty cycle control word $F_{DC1}$ or the second duty cycle control word $F_{DC2}$. If the first duty cycle control word $F_{DC1}$ is changed and the second duty cycle control word $F_{DC2}$ is not changed, the width of the duty cycle control signal may not be changed, and only the period of the duty cycle control signal may be adjusted. If the first duty cycle control word $F_{DC1}$ is not changed and the second duty cycle control word $F_{DC2}$ is changed, the width of the duty cycle control signal may be adjusted, and only the period of the duty cycle control signal may not be changed.

For example, assuming that the first duty cycle control word $F_{DC1}$ is fixed, for example, $F_{DC1}$=2, if a duty cycle control signal having a duty cycle that is equal to a target duty cycle TDC=½ needs to be obtained, the second duty cycle control word $F_{DC2}$ can be set to 4; if a duty cycle control signal having a duty cycle that is equal to a target duty cycle TDC=⅓ needs to be obtained, the second duty cycle control word $F_{DC2}$ can be set to 6; and if a duty cycle control signal having a duty cycle that is equal to a target duty cycle TDC=¼ needs to be obtained, the second duty cycle control word $F_{DC2}$ can be set to 8, and so on.

Similarly, assuming that the second duty cycle control word $F_{DC2}$ is fixed, for example, $F_{DC2}$=100, if a duty cycle control signal having a duty cycle that is equal to a target duty cycle TDC=½ needs to be obtained, the first duty cycle control word $F_{DC1}$ can be set to 50; if a duty cycle control signal having a duty cycle that is equal to a target duty cycle TDC=⅓ needs to be obtained, the first duty cycle control word $F_{DC1}$ can be set to 33; if a duty cycle control signal having a duty cycle that is equal to a target duty cycle TDC=¼ needs to be obtained, the first duty cycle control word $F_{DC1}$ can be set to 25, and so on.

The duty cycle adjustment circuit provided by the embodiments of the present disclosure has the advantages of high efficiency, low power consumption, high resolution, etc., and can be integrated in various types of chips to achieve to control of the controlled circuit.

For example, the modulation parameter may include a reference frequency, a spread spectrum depth coefficient, a spread spectrum reference value, a modulation rate, a modulation mode, or the like, which correspond to the spread spectrum output signal.

For example, the reference frequency is the operating frequency of the circuit system, so that the reference frequency is determined based on the operating requirements of the circuit system. The present disclosure does not limit the specific value of the reference frequency.

For example, the spread spectrum depth coefficient may be determined according to the spread spectrum depth of the frequency of the spread spectrum output signal. For example, in some embodiments, if the reference frequency of the spread spectrum output signal is 100 MHz, the spread spectrum depth of the spread spectrum output signal is 20 MHz, that is, the frequency range of the spread spectrum output signal is from 90 MHz to 110 MHz, so that the spread spectrum depth coefficient may be ±0.1 (i.e., ±(the spread spectrum depth/2)/reference frequency).

For example, in some embodiments, the spread spectrum reference value may be set by the user according to actual needs, and for example, the spread spectrum reference value may be 0.5. In other embodiments, the spread spectrum reference value may also be determined by the operating frequency (i.e., the reference frequency) of the circuit system, that is, the reference frequency corresponds to a reference frequency control word, and a decimal part of the reference frequency control word is the spread spectrum reference value.

For example, the modulation rate represents the speed at which the frequency control word changes over time.

For example, the modulation mode may include a triangle modulation mode, a sawtooth modulation mode, a sinusoidal modulation mode, a random modulation mode, other custom modes, and the like. The user can select the corresponding modulation mode according to the actual application requirements. For example, different clock spread spectrum circuits may correspond to different modulation modes. But the present disclosure is not limited in this aspect, and different clock spread spectrum circuits may also correspond to the same modulation mode. For example, the same clock spread spectrum circuit may also correspond to different modulation modes, and different modulation modes may respectively correspond to different application scenarios of the clock spread spectrum circuit. The present disclosure does not specifically limit the type, the selection method, or the like of the modulation mode.

For example, the integer part I of the frequency control word is determined by the reference frequency. The decimal part r(t) of the frequency control word is determined by the spread spectrum depth coefficient, the spread spectrum reference value, the modulation rate, and the modulation mode.

For example, in some embodiments, the spread spectrum depth coefficient, the modulation mode, and the modulation rate may all be set by the user according to actual needs.

For example, the control circuit 11 may be implemented by hardware, and alternatively, the control circuit 11 may also be implemented by a combination of hardware and software. In some embodiments, the control circuit 11 may be implemented by hardware or the combination of hardware and software.

For example, in some embodiments, as illustrated in FIG. 2A and FIG. 2B, the control circuit 11 may include a decimal generation sub-circuit 110, an integer generation sub-circuit 111, and a synthesis sub-circuit 112. For example, the decimal generation sub-circuit 110 is configured to generate the decimal part r(t) of the frequency control word F(t) according to the spread spectrum depth coefficient D, the spread spectrum reference value Cr, the modulation mode Am, and the modulation rate $V_F$; the integer generation sub-circuit 111 is configured to generate the integer part I of the frequency control word F(t) according to the reference frequency $f_w$; and the synthesis sub-circuit 112 is configured to receive the decimal part r(t) of the frequency control word F(t) and the integer part I of the frequency control word F(t) and generate the frequency control word F(t) according to the decimal part r(t) of the frequency control word F(t) and the integer part I of the frequency control word F(t).

For example, in some embodiments, the decimal generation sub-circuit 110 is further configured to store the value of the decimal part r(t) of the frequency control word F(t). The integer generation sub-circuit 111 is further configured to store the value of the integer part I of the frequency control word F(t).

Figure 5A:
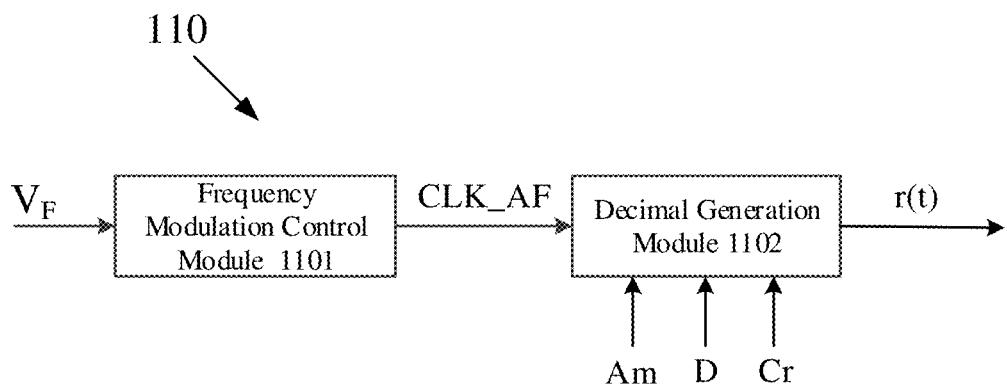
FIG. 5A is a schematic diagram of a decimal generation sub-circuit provided by some embodiments of the present disclosure.
Figure 5B:
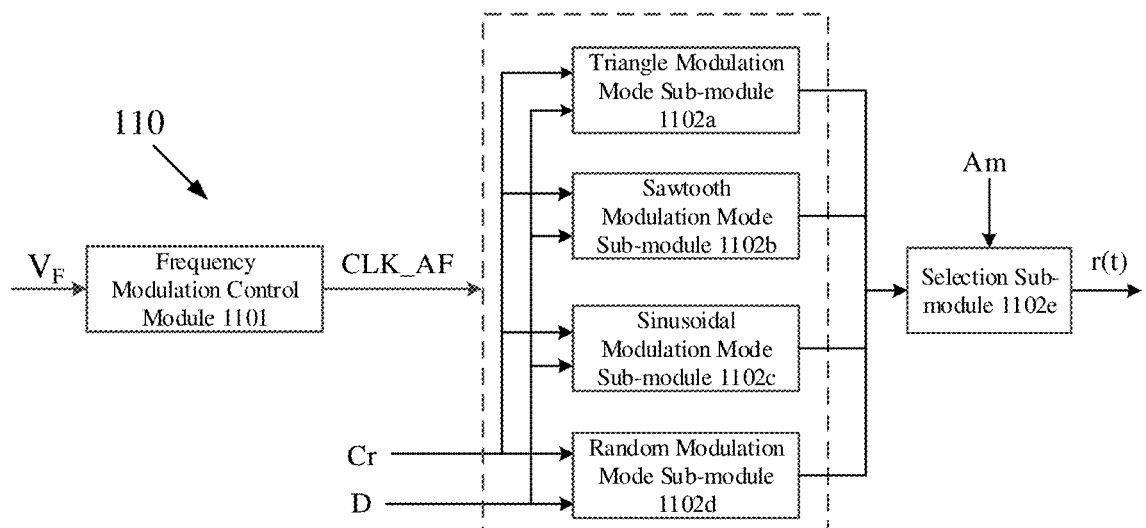
FIG. 5B is a schematic diagram of another decimal generation sub-circuit provided by some embodiments of the present disclosure.

FIG. 5A is a schematic diagram of a decimal generation sub-circuit provided by some embodiments of the present disclosure, and FIG. 5B is a schematic diagram of another decimal generation sub-circuit provided by some embodiments of the present disclosure.

For example, as illustrated in FIG. 5A, in other embodiments, the decimal generation sub-circuit 110 may include a frequency modulation control module (or a frequency modulation control sub-circuit) 1101 and a decimal generation module (or a generation sub-circuit) 1102. The frequency modulation control module 1101 is configured to generate a frequency modulation clock signal CLK_AF according to the modulation rate $V_F$ to control the rate of change of the decimal part r(t) of the frequency control word F(t) and finally control the rate of change of the frequency control word F(t). The decimal generation module 1102 is configured to generate and output the decimal part r(t) to the synthesis sub-circuit 112 according to the modulation mode Am, the spread spectrum depth coefficient D, and the spread spectrum reference value Cr under control of the frequency modulation clock signal CLK_AF.

For example, the spread spectrum mode of the spread spectrum output signal is central spread spectrum, and the range of the decimal part r(t) is: Cr−D/2≤r(t)≤Cr+D/2, so that the range of the frequency control word F(t) is: I+Cr−D/2≤F(t)≤I+Cr+D/2. In this case, the maximum value Fmax of the frequency control word is I+Cr+(D/2), and the minimum value Fmin of the frequency control word is I+Cr−(D/2). For another example, the spread spectrum mode of the spread spectrum output signal is up spread spectrum, and the range of the decimal part is: Cr−D≤r(t)≤Cr, so that the range of the frequency control word F(t) is: I+Cr−D≤F(t)≤I+Cr. In this case, the maximum value Fmax of the frequency control word is I+Cr, and the minimum value Fmin of the frequency control word is I+Cr−D. For another example, the spread spectrum mode of the spread spectrum output signal is down spread spectrum, and the range of the decimal part is: Cr≤r(t)≤Cr+D, so that the range of the frequency control word F(t) is: I+Cr≤F(t)≤I+Cr+D. In this case, the maximum value Fmax of the frequency control word is I+Cr+D, and the minimum value Fmin of the frequency control word is I+Cr.

For example, in some embodiments, the decimal generation module 1102 may include a modulation mode sub-module, and the modulation mode sub-module is used to control the spread spectrum mode of the decimal part r(t). For example, the modulation mode sub-module is configured to generate the decimal part r(t) by using any one of the modulation modes such as a triangle modulation mode, a sawtooth modulation mode, a sinusoidal modulation mode, and a random modulation mode.

For example, in other embodiments, the decimal generation module 1102 may include a selection sub-module and a plurality of modulation mode sub-modules corresponding to a plurality of modulation modes. As illustrated in FIG. 5B, the decimal generation module 1102 may include a triangle modulation mode sub-module 1102a, a sawtooth modulation mode sub-module 1102b, a sinusoidal modulation mode sub-module 1102c, a random modulation mode sub-module 1102d, and a selection sub-module 1102e. The triangle modulation mode sub-module 1102a is configured to generate a first middle decimal part corresponding to the triangle modulation mode according to the triangle modulation mode, the spread spectrum depth coefficient D, and the spread spectrum reference value Cr. The sawtooth modulation mode sub-module 1102b is configured to generate a second middle decimal part corresponding to the sawtooth modulation mode according to the sawtooth modulation mode, the spread spectrum depth coefficient D, and the spread spectrum reference value Cr. The sinusoidal modulation mode sub-module 1102c is configured to generate a third middle decimal part corresponding to the sinusoidal modulation mode according to the sinusoidal modulation mode, the spread spectrum depth coefficient D, and the spread spectrum reference value Cr. The random modulation mode sub-module 1102d is configured to generate a fourth middle decimal part corresponding to the random modulation mode according to the random modulation mode, the spread spectrum depth coefficient D, and the spread spectrum reference value Cr. The selection sub-module 1102e is configured to select one from a group consisting of the first middle decimal part, the second middle decimal part, the third middle decimal part, and the fourth middle decimal part as the decimal part r(t) of the frequency control word F(t) according to the modulation mode Am. For example, in one example, in a case where the modulation mode Am set by the user is the triangle modulation mode, the selection sub-module 1102e selects the first middle decimal part as the decimal part r(t) of the frequency control word F(t).

For example, the selection sub-module 1102e may include a multiplexer, and the multiplexer may be, for example, a 4-to-1 multiplexer.

In the example illustrated in FIG. 5B, the selection sub-module 1102e selects a corresponding middle decimal part corresponding to the modulation mode Am from the plurality of middle decimal parts according to the modulation mode Am and outputs the corresponding middle decimal part. However, the present disclosure is not limited in this aspect. For example, in other embodiments, the selection sub-module 1102e may select the mode control signal corresponding to the modulation mode Am from the mode control signal group according to the modulation mode Am, and the mode control signal group includes the triangle mode control signal, the sawtooth mode control signal, the sinusoidal mode control signal, and the random mode control signal. The mode control signal can be output to the triangle modulation mode sub-module 1102a, the sawtooth modulation mode sub-module 1102b, the sinusoidal modulation mode sub-module 1102c, and the random modulation mode sub-module 1102d, and the modulation mode sub-module corresponding to the modulation mode Am can generate and output the middle decimal part corresponding to the modulation mode Am under control of the mode control signal. For example, in some examples, if the modulation mode Am is the sawtooth modulation mode, the selection sub-module 1102e may select the sawtooth mode control signal from the mode control signal group, and then the sawtooth mode control signal is output to the triangle modulation mode sub-module 1102a, the sawtooth modulation mode sub-module 1102b, the sinusoidal modulation mode sub-module 1102c, and the random modulation mode sub-module 1102d. However, only the sawtooth modulation mode sub-module 1102b can generate and output the second middle decimal part corresponding to the sawtooth modulation mode under control of the sawtooth mode control signal, and none of the triangle modulation mode sub-module 1102a, the sinusoidal modulation mode sub-module 1102c, and the random modulation mode sub-module 1102d can generate the signal under control of the sawtooth mode control signal.

For example, in still other embodiments, the decimal generation module 1102 may include a plurality of modulation mode sub-modules corresponding to a plurality of modulation modes in one-to-one correspondence manner. In this case, only the modulation mode sub-module corresponding to the modulation mode Am set by the user can generate the middle decimal part, and the middle decimal part is output to the synthesis sub-circuit 112 as the decimal part r(t) of the frequency control word F(t), that is, the modulation mode Am can control the modulation mode sub-module corresponding to the modulation mode Am among the plurality of modulation mode sub-modules to generate the middle decimal part corresponding to the corresponding modulation mode according to the corresponding modulation mode, the spread spectrum depth coefficient D, and the spread spectrum reference value Cr. For example, in one example, the decimal generation module 1102 may include the triangle modulation mode sub-module 1102a, the sawtooth modulation mode sub-module 1102b, the sinusoidal modulation mode sub-module 1102c, and the random modulation mode sub-module 1102d, the triangle modulation mode sub-module 1102a corresponds to the triangle modulation mode, the sawtooth modulation mode sub-module 1102b corresponds to the sawtooth modulation mode, the sinusoidal modulation mode sub-module 1102c corresponds to the sinusoidal modulation mode, and the random modulation mode sub-module 1102d corresponds to the random modulation mode. In a case where the modulation mode Am set by the user is the sinusoidal modulation mode, only the sinusoidal modulation mode sub-module 1102c can generate the third middle decimal part corresponding to the sinusoidal modulation mode according to the sinusoidal modulation mode, the spread spectrum depth coefficient D, and the spread spectrum reference value Cr, and then the third middle decimal part can be output to the synthesis sub-circuit 112 as the decimal part r(t) of the frequency control word F(t). In this case, the decimal generation module 1102 may not include the selection sub-module 1102e.

For example, for the triangle modulation mode, the sawtooth modulation mode, and the sinusoidal modulation mode, the decimal part r(t) is an approximate curve that changes regularly. Therefore, each of the triangle modulation mode sub-module 1102a, the sawtooth modulation mode sub-module 1102b, and the sinusoidal modulation mode sub-module 1102c may include an adder, a memory, a subtractor, a comparator, and the like.

In the following, the triangle modulation mode sub-module 1102a is taken as an example to describe the working principle of the modulation mode sub-module in detail. The memory in the triangle modulation mode sub-module 1102a is used to store the change step size of the decimal part r(t). For example, in the case where the spread spectrum reference value Cr is 0.5, the spread spectrum depth coefficient D is 0.5, and the spread spectrum mode of the spread spectrum output signal is central spread spectrum, the range of the decimal part r(t) is 0.25-0.75, i.e., 0.5(the spread spectrum reference value Cr)±(0.5(the spread spectrum depth coefficient D)/2), and the change step size of the triangle modulation mode can be 0.01. The first value of the decimal part r(t) can be the spread spectrum reference value Cr, i.e., 0.5, the first value (i.e., the spread spectrum reference value Cr) is increased by 0.01 using the adder in the triangle modulation mode sub-module 1102a to obtain the second value 0.51 of the decimal part r(t), the second value is increased by 0.01 using the adder to obtain the third value 0.52 of the decimal part r(t), and so on. Until the value of the decimal part r(t) is 0.75 (i.e., the maximum value of the decimal part), the maximum value (i.e., 0.75) is increased by −0.01 using the adder, that is, the maximum value is subtracted by 0.01 using the adder, so as to obtain the N-th value 0.74 of the decimal part r(t), then the N-th value is subtracted by 0.01 using the adder to obtain the (N+1)-th value 0.73 of the decimal part r(t), and so on. Until the value of the decimal part r(t) is 0.25 (i.e., the minimum value of the decimal part), the minimum value (i.e., 0.25) is increased by 0.01 again using the adder to obtain the (N+q)-th value 0.26 of the decimal part r(t), then the (N+q)-th value is increased by 0.01 using the adder to obtain the (N+q+1)-th value 0.27 of the decimal part r(t), and so on. Until the value of the decimal part r(t) is 0.5 (i.e., the spread spectrum reference value Cr), one cycle is completed. In other words, the initial value and the final value of a cycle are the same, and the value of the decimal part r(t) in the cycle reaches the maximum value once and reaches the minimum value once. The above process is continuously repeated, so that the decimal part r(t) can be generated. For example, the memory in the triangle modulation mode sub-module 1102a may also be used to store the generated decimal part r(t), the spread spectrum reference value Cr, the spread spectrum depth coefficient D, etc.

It should be noted that the rate of change of the value of the decimal part r(t) is controlled by the frequency modulation clock signal CLK_AF, that is, the frequency modulation clock signal CLK_AF can control such as the time interval between the operation of increasing the first value by 0.01 and the operation of increasing the second value by 0.01.

For example, for the random modulation mode, the decimal part r(t) is composed of a series of irregularly changing random values. The random modulation mode sub-module 1102d may be implemented by a pseudo-random binary sequence (PRBS) circuit, and the pseudo-random values generated by the PRBS circuit have a large cycle period, so that it can be approximated that the pseudo-random values changes irregularly. For example, the PRBS circuit may include a group of registers.

It should be noted that, as described above, in some embodiments, as illustrated in FIG. 5B, each modulation mode sub-module in the decimal generation module 1102 generates the middle decimal part corresponding to the corresponding modulation mode according to the corresponding modulation mode, the spread spectrum depth coefficient D, and the spread spectrum reference value Cr. In other words, the decimal generation module 1102 can generate a plurality of middle decimal parts, and then the selection sub-module 1102e selects the middle decimal part corresponding to the modulation mode Am from the plurality of middle decimal parts according to the modulation mode Am.

For example, in some embodiments, the decimal generation sub-circuit 110 may further include a spread spectrum depth control module and a reference value control module. The spread spectrum depth control module is configured to determine the spread spectrum depth coefficient D and transmit the spread spectrum depth coefficient D to the decimal generation module 1102; and the reference value control module is configured to determine the spread spectrum reference value Cr and transmit the spread spectrum reference value Cr to the decimal generation module 110. For example, the spread spectrum depth control module can directly obtain the spread spectrum depth coefficient D input by the user, and the reference value control module can directly obtain the spread spectrum reference value Cr input by the user. The spread spectrum depth control module may include a first storage circuit, the first storage circuit is used for storing the spread spectrum depth coefficient D (for example, the spread spectrum depth coefficient D is 0.5), and the first storage circuit may include various types of storage media, registers, or the like. The reference value control module may also include a second storage circuit, the second storage circuit is used for storing the spread spectrum reference value Cr (for example, the spread spectrum reference value Cr is 0.5), and the second storage circuit may include various types of storage media, registers, or the like. The spread spectrum depth coefficient D and the spread spectrum reference value Cr determine the spread spectrum range, i.e., the spread spectrum depth, of the spread spectrum output signal together.

For another example, the user can input the reference frequency and the spread spectrum depth, the spread spectrum depth control module can obtain the reference frequency and the spread spectrum depth and determine the spread spectrum depth coefficient D according to the reference frequency and the spread spectrum depth, and the reference value control module acquires the reference frequency and determine the spread spectrum reference value Cr according to the reference frequency. In this case, the spread spectrum depth control module may include a first storage circuit and a first calculation circuit, and the reference value control module may also include a second storage circuit and a second calculation circuit. The first calculation circuit in the spread spectrum depth control module is used to calculate the spread spectrum depth coefficient D according to the reference frequency and the spread spectrum depth, and the first storage circuit in the spread spectrum depth control module is used to store the spread spectrum depth coefficient D. The second calculation circuit in the reference value control module is used to calculate the spread spectrum reference value Cr according to the reference frequency, and the second storage circuit in the reference value control module is used to store the spread spectrum reference value Cr. It should be noted that both the first calculation circuit in the spread spectrum depth control module and the second calculation circuit in the reference value control module may be composed of components such as transistors, resistors, flip-flops, capacitors, operational amplifiers, etc.

For example, the spread spectrum depth coefficient D and the spread spectrum reference value Cr may be directly input to the decimal generation module 1102 by the user through an input device (e.g., a keyboard, a touch screen, a touch pad, a mouse, a knob, etc.) by a data interface. In this case, the decimal generation sub-circuit 110 may not include the spread spectrum depth control module and the reference value control module.

For example, the modulation mode Am may also be directly input to the decimal generation module 1102 by the user through the input device by the data interface.

Figure 6:
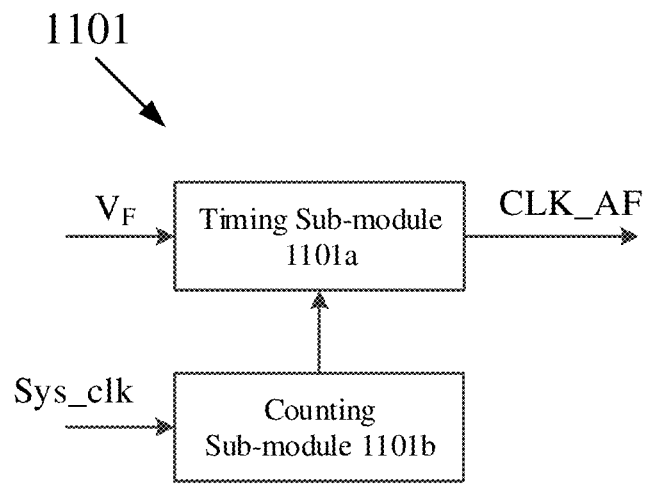
FIG. 6 is a schematic block diagram of a frequency modulation control module provided by some embodiments of the present disclosure.

FIG. 6 is a schematic block diagram of a frequency modulation control module provided by some embodiments of the present disclosure. For example, as illustrated in FIG. 6, the frequency modulation control module 1101 includes a timing sub-module 1101a and a counting sub-module 1101b. The counting sub-module 1101b is configured to count the reference clock signal Sys_clk to obtain the count value of the reference clock signal Sys_clk; and the timing sub-module 1101a is configured to determine the count period according to the modulation rate $V_F$ and determine the frequency modulation clock signal CLK_AF based on the count period and the count value.

For example, the modulation rate $V_F$ may be directly input to the timing sub-module 1101a by the user through the input device by the data interface.

For example, the count period may represent the duration of each frequency control word. For example, for the triangle modulation mode, if the frequency modulation of the frequency control word is 31.25 kHz, the modulation period corresponding to the frequency modulation is 0.000032 s (that is, 1/31250=0.000032). The modulation period represents the change period of the frequency control word. If the frequency control word needs to be changed 64 times in the modulation period, the duration of each frequency control word is 0.0000032 s/64=500 nanoseconds (ns), that is, in a case where the duration of each frequency control word is 500 ns, the requirement of the frequency modulation 31.25 kHz can be satisfied. In other words, the count period is 500 ns. For example, supposing that in a case where the count period is 500 ns, the number of pulses of the reference clock signal Sys_clk in the count period is 300, and in a case where the count value output by the counting sub-module 1101b is 1 to 150, the timing sub-module 1101a can output the binary number 0, that is, the value of the frequency modulation clock signal CLK_AF is 0; and in a case where the count value output by the counting sub-module 1101b is 150 to 300, the timing sub-module 1101a can output the binary number 1, that is, the value of the frequency modulation clock signal CLK_AF is 1. In a case where the count value reaches 300, the timing sub-module 1101a can control the counting sub-module 1101b to reset the count value to 0 to restart counting. In this way, the frequency modulation clock signal CLK_AF with a period of 500 nanoseconds can be obtained. The frequency of the frequency modulation clock signal CLK_AF is lower than the frequency of the reference clock signal Sys_clk.

For example, as illustrated in FIG. 6, the reference clock signal Sys_clk may be the clock signal of the system.

For example, the timing sub-module 1101a and the counting sub-module 1101b may be implemented by hardware circuits. The timing sub-module 1101a and the counting sub-module 1101b may be composed of components such as transistors, diodes, resistors, flip-flops, capacitors, operational amplifiers, etc. For example, the counting sub-module 1101b may include an addition counter and the like. Certainly, the functions of the counting sub-module 1101b may also be implemented by software. For example, the frequency modulation control module 1101 may further include a storage sub-module for storing computer instructions and data, and the processor may execute the computer instructions and data stored in the storage sub-module to implement the functions of the counting sub-module 1101b.

For example, as illustrated in FIG. 2A and FIG. 2B, in some embodiments, the reference frequency $f_w$ may be input to the integer generation sub-circuit 111 by the user through the input device by the data interface. In this case, the integer generation sub-circuit 111 may include a calculation module and a storage module, the calculation module is used to calculate the reference frequency control word corresponding to the reference frequency $f_w$ according to the reference frequency $f_w$, the integer part of the reference frequency control word is the value of the integer part I of the frequency control word F(t), and the storage module is used to store the value of the integer part I. The storage module may be various types of storage media, registers, or the like. The calculation module may be composed of components such as transistors, resistors, flip-flops, capacitors, operational amplifiers, etc.

For another example, in other embodiments, the clock spread spectrum circuit 10 may be connected to a calculator, and the calculator can be used to calculate the value of the integer part I according to the reference frequency $f_w$, and the integer generation sub-circuit 111 may obtain the value of the integer part I directly from the calculator. In this case, the integer generation sub-circuit 111 may include only the storage module for storing the value of the integer part I.

For example, as illustrated in FIG. 2A and FIG. 2B, the synthesis sub-circuit 112 is used to integrate the integer part I and the decimal part r(t) together to obtain the frequency control word F(t). The synthesis sub-circuit 112 may include a logic circuit, a register, etc.

For example, as illustrated in FIG. 2A and FIG. 2B, the signal generation circuit 12 includes a base time unit generation sub-circuit 120 and a spread spectrum sub-circuit 121. The base time unit generation sub-circuit 120 is configured to generate and output a base time unit, and the spread spectrum sub-circuit 121 is configured to generate and output the spread spectrum output signal according to the frequency control word and the base time unit Δ.

For example, as illustrated in FIG. 2A and FIG. 2B, the base time unit generation sub-circuit 120 is configured to output the base time unit Δ to the integer generation sub-circuit 111. The integer generation sub-circuit 111 may calculate the reference frequency control word corresponding to the reference frequency $f_w$ according to the reference frequency $f_w$ and the base time unit Δ, thereby determining the value of the integer part I of the frequency control word F(t). For example, the reference frequency control word may be expressed as:

$$F_w = 1/(f_w * \Delta) = I_w + r_w$$

where $F_w$ represents the reference frequency control word, $I_w$ represents the integer part of the reference frequency control word, and $r_w$ represents the decimal part of the reference frequency control word. The integer part I of the frequency control word F(t) is the integer part $I_w$ of the reference frequency control word. For example, in some examples, the spread spectrum reference value Cr may be the decimal part $r_w$ of the reference frequency control word.

For example, as illustrated in FIG. 2A and FIG. 2B, the base time unit generation sub-circuit 120 is further configured to output the base time unit Δ to the spread spectrum sub-circuit 121. For example, the base time unit generation sub-circuit 120 is configured to receive the target voltage Vta and generate and output a base time unit based on the target voltage Vta.

Figure 7A:
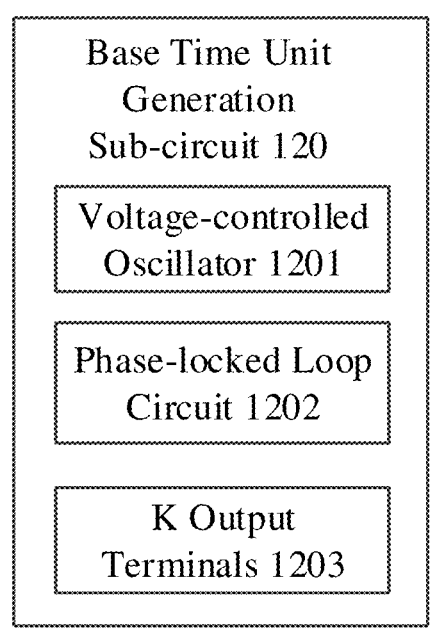
FIG. 7A illustrates a schematic block diagram of a base time unit generation sub-circuit provided by some embodiments of the present disclosure.
Figure 7B:
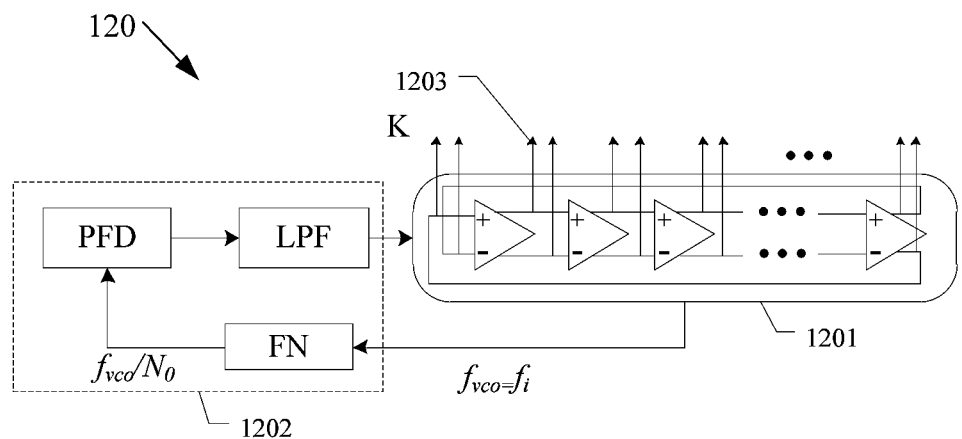
FIG. 7B illustrates a schematic structural diagram of another base time unit generation sub-circuit provided by some embodiments of the present disclosure.
Figure 8:
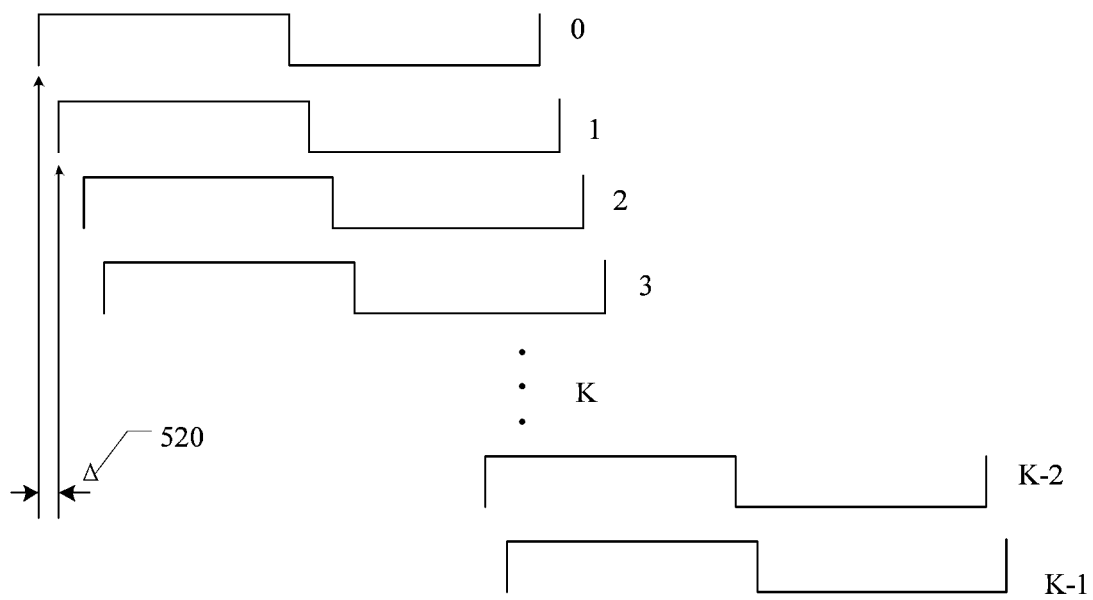
FIG. 8 illustrates a schematic diagram of K second base output signals with phases evenly spaced provided by some embodiments of the present disclosure.

FIG. 7A illustrates a schematic block diagram of a base time unit generation sub-circuit provided by some embodiments of the present disclosure; FIG. 7B illustrates a schematic structural diagram of another base time unit generation sub-circuit provided by some embodiments of the present disclosure; and FIG. 8 illustrates a schematic diagram of K second base output signals with phases evenly spaced provided by some embodiments of the present disclosure.

For example, the base time unit generation sub-circuit 120 is configured to generate and output K second base output signals with phases evenly spaced based on the target voltage Vta. The base time unit generation sub-circuit 120 may use the phase locked loop (PLL), delay locked loop (DLL), Johnson counter, or the like to generate the K second base output signals with phases evenly spaced. As illustrated in FIG. 7A, in some embodiments, the base time unit generation sub-circuit 120 may include a voltage-controlled oscillator (VCO) 1201, a phase-locked loop circuit 1202, and K output terminals 1203. The voltage-controlled oscillator 1201 is configured to oscillate at a predetermined oscillation frequency. The phase-locked loop circuit 1202 is configured to lock the output frequency of the voltage-controlled oscillator 1201 to the base output frequency. The K output terminals 1203 are configured to output the K second base output signals with phases evenly spaced, and K is a positive integer greater than 1. For example, K=16, 32, 128, or other values.

For example, the periods of the K second base output signals are the same and the frequencies of the K second base output signals are the same. The duty cycle of each second base output signal is the same as the duty cycle of the target voltage Vta, that is, the duty cycle of the second base output signal is the target duty cycle.

For example, the base time unit may be expressed as Δ, and the base output frequency may be expressed as $f_d$. As illustrated in FIG. 8, the base time unit Δ is a time span between any two adjacent output signals output by the K output terminals 1203. The base time unit Δ is usually generated by a plurality of voltage-controlled oscillators 1201. The frequency $f_{vco}$ of the signal generated by the voltage-controlled oscillator 1201 may be locked to the known base output frequency $f_d$ by the phase-locked loop circuit 1202, that is, $f_d = f_{vco}$.

For example, the base time unit Δ may be calculated through the following formula:

$$\Delta = T_d / K = 1/(K \cdot f_d)$$

where $T_d$ represents the period of the signal generated by the plurality of voltage-controlled oscillators 1201, and $f_\Delta$ represents the value of the frequency of the base time unit, that is, $f_\Delta = 1/\Delta = K \cdot f_d$.

For example, as illustrated in FIG. 7B, the phase-locked loop circuit 1202 includes a phase detector PFD, a loop filter LPF, and a frequency divider FN. For example, in the embodiments of the present disclosure, firstly, for example, a reference signal having a reference frequency may be input to the phase detector PFD, the loop filter LPF, and then the voltage-controlled oscillator, and finally, the signal with the predetermined oscillation frequency $f_{vco}$ generated by the voltage-controlled oscillator can be divided through the frequency divider FN to obtain the division frequency $f_{vco}/N_0$ of the frequency division signal, where $N_0$ represents the frequency division coefficient of the frequency divider, and $N_0$ is a real number and greater than or equal to 1. The division frequency $f_{vco}/N_0$ is fed back to the phase detector PFD, and the phase detector PFD is used to compare the reference frequency of the reference signal with the division frequency $f_{vco}/N_0$. In the case where the reference frequency and the division frequency $f_{vco}/N_0$ have the equal frequency and phase, the error between the reference frequency and the division frequency $f_{vco}/N_0$ is zero. In this case, the phase-locked loop circuit 1202 is in a locked state.

For example, the predetermined oscillation frequency $f_{vco}$ is the frequency of the target voltage Vta.

For example, the loop filter LPF may be a low-pass filter.

It should be noted that the circuit structure illustrated in FIG. 7B is only an exemplary implementation of the base time unit generation sub-circuit 120. The specific structure of the base time unit generation sub-circuit 120 is not limited to this, and the base time unit generation sub-circuit 120 may also be constructed by other circuit structures, and the present disclosure is not limited thereto. For example, K and $\Delta$ can be set in advance according to actual needs and are fixed.

Figure 9:
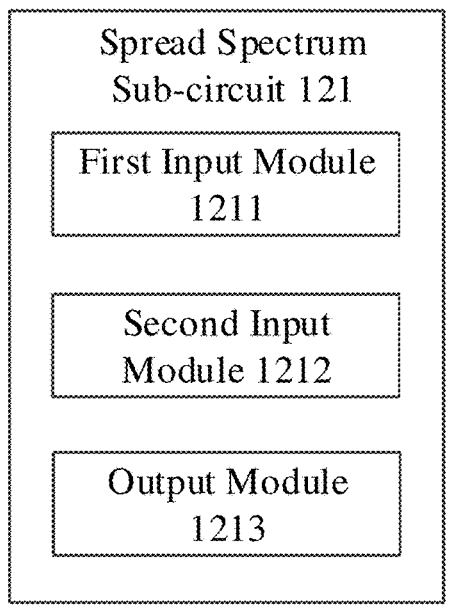
FIG. 9 illustrates a schematic block diagram of a spread spectrum sub-circuit provided by some embodiments of the present disclosure.
Figure 10:
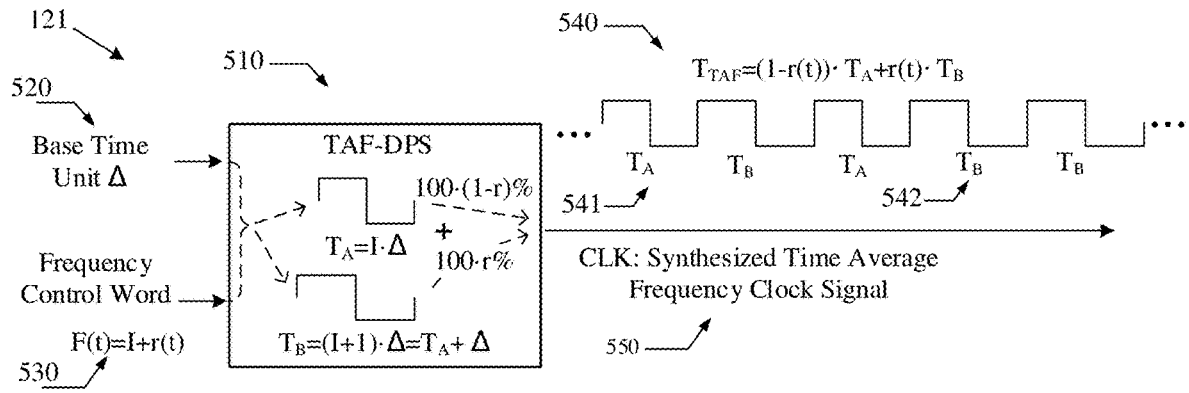
FIG. 10 illustrates a schematic diagram of a working principle of a spread spectrum sub-circuit provided by some embodiments of the present disclosure.

FIG. 9 illustrates a schematic block diagram of a spread spectrum sub-circuit provided by some embodiments of the present disclosure, and FIG. 10 illustrates a schematic diagram of a working principle of a spread spectrum sub-circuit provided by some embodiments of the present disclosure.

For example, as illustrated in FIG. 9, the spread spectrum sub-circuit 121 includes a first input module 1211, a second input module 1212, and an output module 1213. The first input module 1211 is configured to receive the K second base output signals with phase evenly spaced and the base time unit from the base time unit generation sub-circuit 120. The second input module 1212 is configured to receive the frequency control word F(t) from the control circuit 11. The output module 1213 is configured to generate a first period and a second period, generate a spread spectrum output signal according to the first period and the second period, and output the spread spectrum output signal. The occurrence probability of the first period and the second period is controlled by the value of the decimal part r(t) of the frequency control word F(t).

For example, the spread spectrum sub-circuit 121 may include a time average frequency direct period synthesizer (TAF-DPS). The TAF-DPS technology is an emerging frequency synthesis technology, and may generate pulse signals of any frequency based on the new time average frequency concept. In other words, the TAF-DPS can achieve fine frequency adjustment with small frequency granularity. In addition, because each single pulse is directly constructed, the output frequency of the TAF-DPS can be changed instantaneously, that is, can have the rapidity of frequency switching. Experiments show that the frequency granularity of the TAF-DPS can reach several ppb (parts per billion). More importantly, the frequency switching speed of the TAF-DPS is quantifiable. That is, the response time from the moment when the frequency control word is updated to the moment when the frequency is switched can be calculated based on the clock period. The TAF-DPS can be used as a specific implementation of the spread spectrum sub-circuit 121 in the embodiments of the present disclosure.

For example, the TAF-DPS may be implemented by an application specific integrated circuit (for example, ASIC) or a programmable logic device (for example, FPGA). Alternatively, the TAF-DPS may be implemented by conventional analog circuit devices. The present disclosure is not limited in this aspect.

In the following, the working principle of the spread spectrum sub-circuit 121 based on the TAF-DPS is described with reference to FIG. 10.

For example, as illustrated in FIG. 10, the spread spectrum sub-circuit 121 based on the TAF-DPS 510 has two inputs: a base time unit 520 and a frequency control word 530. The frequency control word 530 is expressed as F(t), F(t)=I+r(t), I is an integer greater than 1, and r(t) is a fraction and changes discretely with time.

For example, the TAF-DPS 510 has an output CLK 550. The output CLK 550 is a synthesized time average frequency clock signal. In the embodiments of the present disclosure, the output CLK 550 is the spread spectrum output signal. According to the base time unit 520, the TAF-DPS 510 can generate two types of periods, that is, a first period $T_A = I \cdot \Delta$, and a second period $T_B = (I+1) \cdot \Delta$. The spread spectrum output signal CLK 550 is a clock pulse string 540, and the clock pulse string 540 is composed of the first period $T_A$ 541 and the second period $T_B$ 542 in an interleaved manner. The fraction r(t) is used to control the occurrence probability of the second period $T_B$, and therefore, r(t) can also determine the occurrence probability of the first period $T_A$.

For example, as illustrated in FIG. 10, the period $T_{TAF}$ of the spread spectrum output signal CLK 550 may be expressed by the following formula:

$$T_{TAF} = (1 - r(t)) \cdot T_A + r(t) \cdot T_B$$
$$= T_A + r(t) \cdot (T_B - T_A)$$
$$= T_A + r(t) \cdot \Delta = I \cdot \Delta + r(t) \cdot \Delta = (I + r(t)) \cdot \Delta$$

Therefore, in the case where the frequency control word 530 is F(t)=I+r(t), it can be obtained that:

$$T_{TAF} = F(t) \cdot \Delta \quad (1)$$

For example, based on the above formula (1), the frequency $f_{css}$ of the spread spectrum output signal CLK 550 can be expressed as:

$$f_{css} = 1/T_{TAF} = 1/(F(t) \cdot \Delta) \quad (2)$$

From the above formula (1) and formula (2), it can be seen that the period $T_{TAF}$ of the spread spectrum output signal CLK 550 output by the TAF-DPS 510 is linearly proportional to the frequency control word 530, and the frequency $f_{css}$ of the spread spectrum output signal CLK 550 is inversely proportional to the frequency control word 530 and has a small linear shape. In a case where the frequency control word 530 changes, the period $T_{TAF}$ of the spread spectrum output signal CLK 550 output by the TAF-DPS 510 also changes in the same form, and the frequency of the spread spectrum output signal CLK 550 also changes accordingly.

Figure 11:
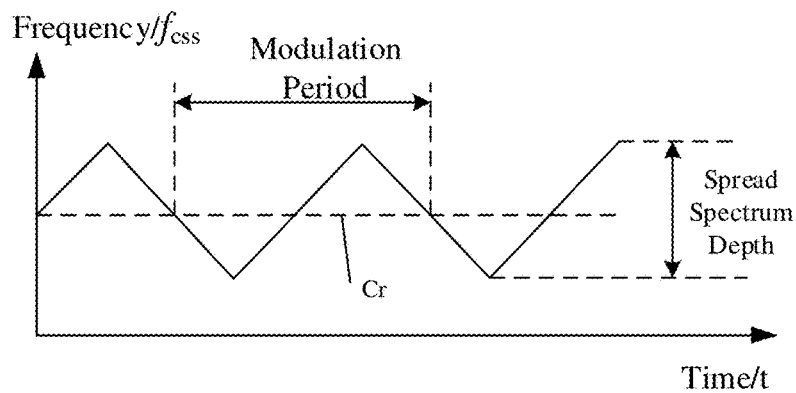
FIG. 11 is a schematic diagram of frequency modulation determined according to a triangle modulation mode provided by some embodiments of the present disclosure.

FIG. 11 is a schematic diagram of frequency modulation determined according to a triangle modulation mode provided by some embodiments of the present disclosure. For example, in a case where the time interval of the decimal part r(t) changing with time is short, the decimal part r(t) is approximately a triangular wave curve, and therefore, the frequency control word F(t) is also approximately a triangular wave curve. As illustrated in the formula (2), the frequency $f_{css}$ of the spread spectrum output signal generated based on the TAF-DPS and the frequency control word 530 are in the corresponding reciprocal form, and the frequency $f_{css}$ has the property of a small amount of linearity, so that as illustrated in FIG. 11, the frequency $f_{css}$ of the spread spectrum output signal is also approximately a triangular wave curve changing with time.

Therefore, in the clock spread spectrum circuit provided by the embodiments of the present disclosure, the frequency of the spread spectrum output signal can be controlled only by controlling the frequency control word F(t). In a case where the frequency control word F(t) is controlled to have waveforms in different modulation modes, the spread spectrum effect of the corresponding modulation mode can be achieved, that is, in the frequency domain, it is expressed as sweeping the frequency within a certain frequency range. If the greater the frequency difference between the maximum value and the minimum value of the frequency control word, the wider the range of spread spectrum, that is, the better the effect of reducing electromagnetic interference. In this way, in a case where the circuit system turns on the spread spectrum function, the basic function of the circuit system is not affected, so that in a case where the circuit system is in normal operation, the spread spectrum function can be turned on all the time, which not only ensures the safety of the circuit system, but also reduces the electromagnetic interference of the circuit system.

In addition, in a case where F(t) changes between two integers, the period of the spread spectrum output signal CLK 550 has only two types, a long period TB and a short period TA. Therefore, when designing a digital circuit, it is only necessary to use the short period to constrain the setup time, and the hold time has nothing to do with the period and is only related to the edge. For the circuit system including the clock spread spectrum circuit, in a case where the spread spectrum function of the circuit system is turned on and turned off, the period of the signal output by the TAF-DPS 510 only comprises two period types, which does not affect the normal function of the circuit system, thereby not only ensuring the normal operation of the circuit system, but also reducing the electromagnetic interference.

For example, according to the formula (2), the frequency of the spread spectrum output signal is inversely proportional to the frequency control word, so that the maximum value of the frequency of the spread spectrum output signal is $1/(Fmin*\Delta)$, the minimum value of the frequency of the spread spectrum output signal is $1/(Fmax*\Delta)$, and the spread spectrum depth of the frequency of the spread spectrum output signal is expressed as: $FD=1/(Fmin*\Delta)-1/(Fmax*\Delta)$, where FD represents the spread spectrum depth.

Figure 12A:
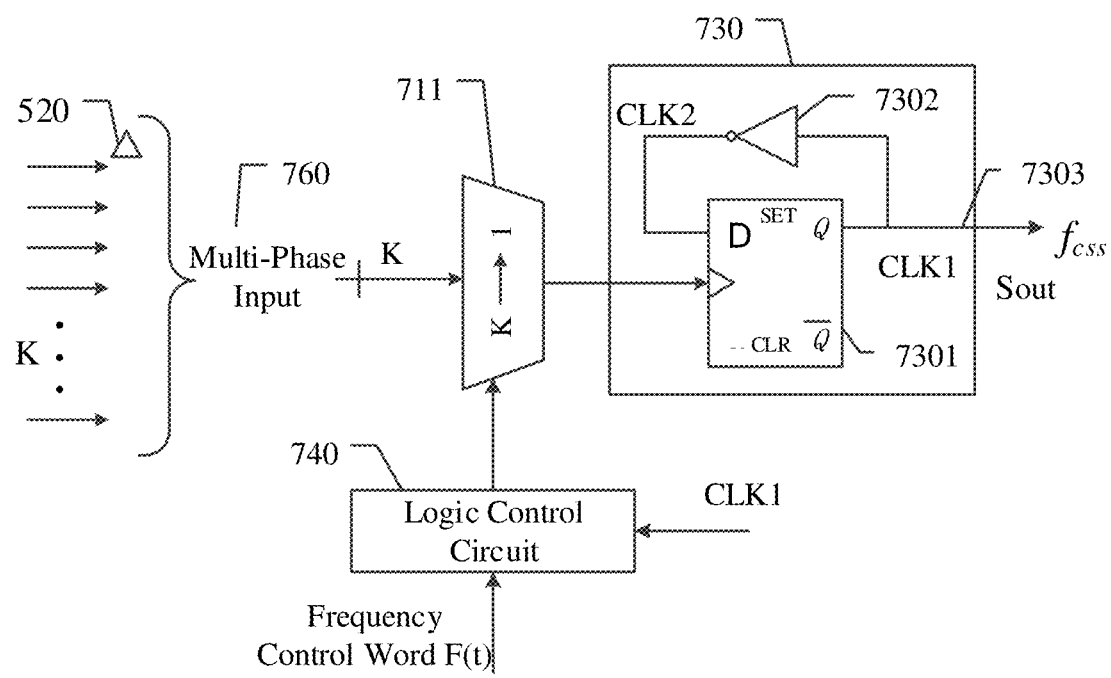
FIG. 12A is a schematic structural diagram of a spread spectrum sub-circuit provided by some embodiments of the present disclosure.
Figure 12B:
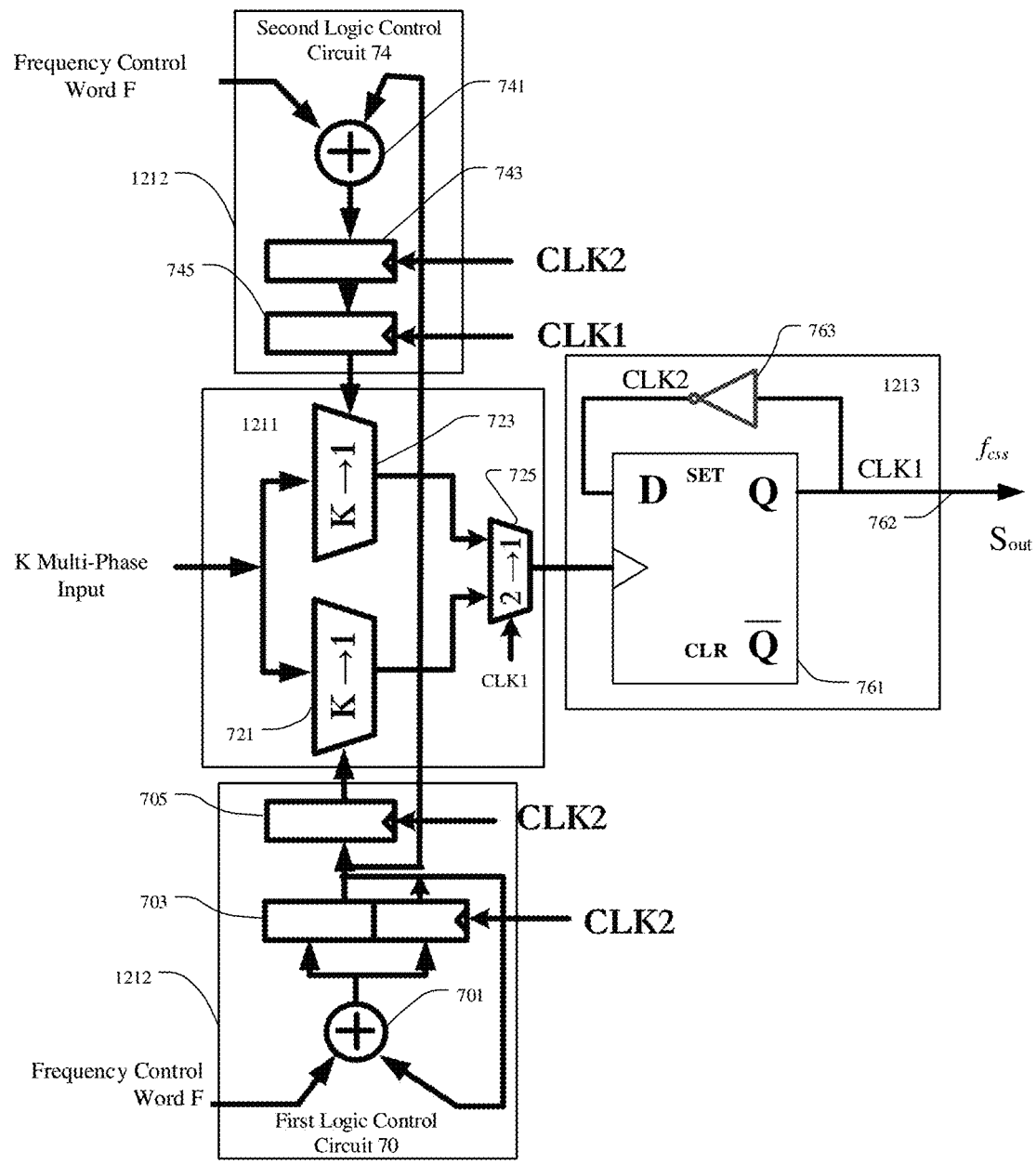
FIG. 12B is a schematic structural diagram of another spread spectrum sub-circuit provided by some embodiments of the present disclosure.

FIG. 12A is a schematic structural diagram of a spread spectrum sub-circuit provided by some embodiments of the present disclosure, and FIG. 12B is a schematic structural diagram of another spread spectrum sub-circuit provided by some embodiments of the present disclosure.

In the following, the circuit structure of the TAF-DPS is described with reference to FIG. 12A and FIG. 12B.

For example, as illustrated in FIG. 12A, in an embodiment, the first input module 1211 includes a K→1 multiplexer 711. The K→1 multiplexer 711 has a plurality of input terminals for receiving K second base output signals with phase evenly spaced, a control input terminal, and an output terminal.

For example, the output module 1213 includes a trigger circuit 730. The trigger circuit 730 is used to generate a pulse string. The pulse string is composed of a pulse signal of the first period $T_A$ and a pulse signal of the second period $T_B$ in an interleaved manner. The trigger circuit 730 includes a D flip-flop 7301, an inverter 7302, and an output terminal 7303. The D flip-flop 7301 includes a data input terminal, a clock input terminal for receiving the output from the output terminal of the K→1 multiplexer 711, and an output terminal for outputting the first clock signal CLK1. The inverter 7302 includes an inverter input terminal for receiving the first clock signal CLK1 and an inverter output terminal for outputting the second clock signal CLK2, and the inverter output terminal is connected to the data input terminal of the D flip-flop 7301 to output the second clock signal CLK2 to the data input terminal of the D flip-flop 7301. The output terminal 7303 of the trigger circuit 730 is used to output the first clock signal CLK1 as the spread spectrum output signal $S_{out}$.

For example, the first clock signal CLK1 includes a pulse string.

For example, the second input module 1212 includes a logic control circuit 740. The logic control circuit 740 includes an input terminal for receiving the frequency control word F(t) output by the control circuit 11, a clock input terminal for receiving the first clock signal CLK1, and an output terminal connected to the control input terminal of the K→1 multiplexer of the first input module 1211.

For example, as illustrated in FIG. 12B, in another embodiment, the first input module 1211 includes a first K→1 multiplexer 721, a second K→1 multiplexer 723, and a 2→1 multiplexer 725. Each of the first K→1 multiplexer 721 and the second K→1 multiplexer 723 includes a plurality of input terminals for receiving K second base output signals with phases evenly spaced, a control input terminal, and an output terminal. The 2→1 multiplexer 725 includes a control input terminal, an output terminal, a first input terminal for receiving the output of the first K→1 multiplexer 721, and a second input terminal for receiving the output of the second K→1 multiplexer 723.

For example, as illustrated in FIG. 12B, the output module 1213 includes a trigger circuit. The trigger circuit is used to generate a pulse string. The trigger circuit includes a D flip-flop 761, an inverter 763, and an output terminal 762. The D flip-flop 761 includes a data input terminal, a clock input terminal for receiving the output from the output terminal of the 2→1 multiplexer 725, and an output terminal for outputting the first clock signal CLK1. The inverter 763 includes an input terminal for receiving the first clock signal CLK1 and an output terminal for outputting the second clock signal CLK2. The output terminal of the inverter 763 is connected to the data input terminal of the D flip-flop 761 to output the second clock signal CLK2 to the data input terminal of the D flip-flop 761. The output terminal 762 of the trigger circuit is used to output the first clock signal CLK1 as the spread spectrum output signal $S_{out}$.

For example, the first clock signal CLK1 is connected to the control input terminal of the 2→1 multiplexer 725.

For example, as illustrated in FIG. 12B, the second input module 1212 includes a first logic control circuit 70 and a second logic control circuit 74. The first logic control circuit 70 includes a first adder 701, a first register 703, and a second register 705. The second logic control circuit 74 includes a second adder 741, a third register 743, and a fourth register 745.

The first adder 701 adds the frequency control word (F(t)) and the most significant bits (for example, 5 bits) stored in the first register 703, and then at the rising edge of the second clock signal CLK2, the addition result is stored in the first register 703. Alternatively, the first adder 701 adds the frequency control word (F(t)) and all the information stored in the first register 703, and then at the rising edge of the second clock signal CLK2, the addition result is stored in the first register 703. At the next rising edge of the second clock signal CLK2, the most significant bits stored in the first register 703 may be stored in the second register 705 and used as the selection signal of the first K→1 multiplexer 721 for selecting one signal from the K multi-phase input signals as the first output signal of the first K→1 multiplexer 721.

The second adder 741 adds the frequency control word (F(t)) and the most significant bits stored in the first register 703, and then at the rising edge of the second clock signal CLK2, the addition result is stored in the third register 743. At the rising edge of the first clock signal CLK1, the information stored in the third register 743 may be stored in the fourth register 745 and used as the selection signal of the second K→1 multiplexer 723 for selecting one signal from the K multiphase input signals as the second output signal of the second K→1 multiplexer 723.

At the rising edge of the first clock signal CLK1, the 2→1 multiplexer 725 selects one of the first output signal from the first K→1 multiplexer 721 and the second output signal from the second K→1 multiplexer 723 as the output signal, which serves as the input clock signal of the D flip-flop 761, of the 2→1 multiplexer 725.

For example, the period ($T_{TAF}$) of the spread spectrum output signal $S_{out}$ output by the TAF-DPS illustrated in FIG. 12A and FIG. 12B can be calculated through the above formula (1). For example, the frequency control word is set in the form of F(t)=I+r(t), where I is an integer and r(t) is a decimal within the range of [0,1).

For example, the duty cycle of the spread spectrum output signal $S_{out}$ may be determined based on the duty cycle of each of the K second base output signals. For example, the duty cycle of the spread spectrum output signal $S_{out}$ may be the same as the duty cycle of each second base output signal. The frequency of the spread spectrum output signal $S_{out}$ is determined based on the frequency control word.

It should be noted that both the spread spectrum sub-circuit and the generation sub-module are implemented based on the TAF-DPS synthesizer, and the structure of the spread spectrum sub-circuit and the structure of the generation sub-module may be the same.

Figure 13:
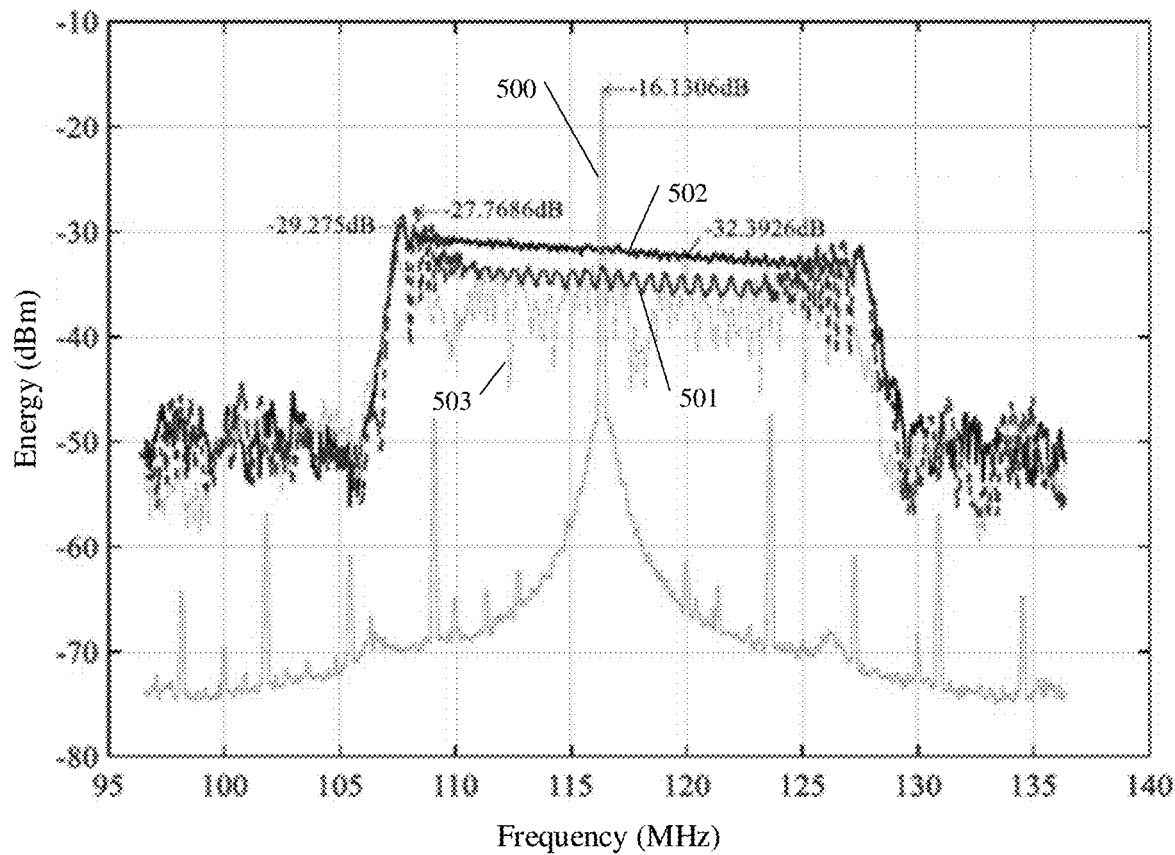
FIG. 13 is a schematic diagram of spectrum comparison results before and after spread spectrum provided by some embodiments of the present disclosure.

FIG. 13 is a schematic diagram of spectrum comparison results before and after spread spectrum provided by some embodiments of the present disclosure. As illustrated in FIG. 13, the reference frequency is represented by a curve 500, the first spread spectrum frequency after spread spectrum according to the triangle modulation mode is represented by a curve 501, the second spread spectrum frequency after spread spectrum according to the sawtooth modulation mode is represented by a curve 502, and the third spread spectrum frequency after spread spectrum according to the random modulation mode is represented by a curve 503. The modulation rate corresponding to the first spread spectrum frequency, the modulation rate corresponding to the second spread spectrum frequency, and the modulation rate corresponding to the third spread spectrum frequency are all 30 kHz, and the resolution bandwidths of the test equipment spectrum analyzer corresponding to the first spread spectrum frequency, the second spread spectrum frequency, and the third spread spectrum frequency are all 120 kHz. The first spread spectrum frequency, the second spread spectrum frequency, and the third spread spectrum frequency are all frequencies of the spread spectrum output signals generated by the same clock spread spectrum circuit provided by the embodiments of the present disclosure based on different modulation modes. As illustrated in FIG. 13, for the reference frequency without spread spectrum, the energy of the peak of the reference frequency is −16.1306 dB, the energy of the first spread spectrum frequency is −29.275 dB, the energy of the second spread spectrum frequency is −32.3926 dB, and the energy of the third spread spectrum frequency is −27.7686 dB. It can be seen from the experimental results that the spread spectrum frequency based on any modulation mode can effectively reduce EMI peak noise.

Figure 14:
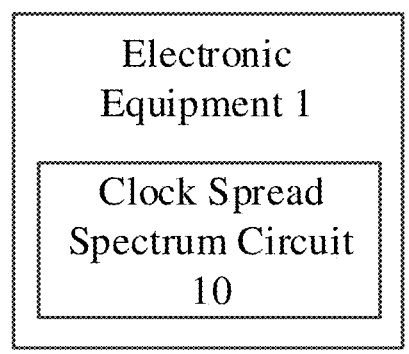
FIG. 14 is a schematic block diagram of an electronic equipment provided by some embodiments of the present disclosure.
Figure 15:
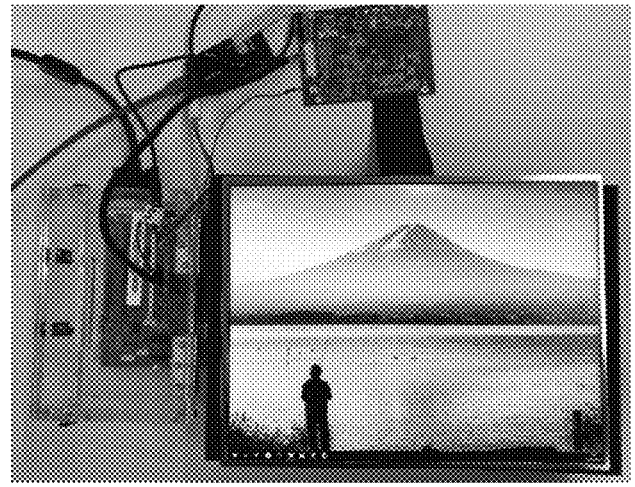
FIG. 15 is a screenshot of an electronic equipment under normal operation provided by some embodiments of the present disclosure.

At least one embodiment of the present disclosure further provides an electronic equipment. FIG. 14 is a schematic block diagram of an electronic equipment provided by some embodiments of the present disclosure, and FIG. 15 is a screenshot of an electronic equipment under normal operation provided by some embodiments of the present disclosure.

For example, as illustrated in FIG. 14, the electronic equipment 1 provided by the embodiments of the present disclosure may include the clock spread spectrum circuit 10 according to any one of the above embodiments.

For example, the electronic equipment 1 may be a liquid crystal display device or the like, and the clock spread spectrum circuit 10 may be applied to a TCON of the liquid crystal display device. As illustrated in FIG. 15, in a case where the liquid crystal display device displays, the spread spectrum function of the liquid crystal display device is turned on, and the display effect of the liquid crystal display device is not be affected.

It should be noted that, detailed descriptions of the clock spread spectrum circuit 10 may be with reference to the related descriptions of the clock spread spectrum circuit in the above embodiments, and details are not described herein again.

Figure 16A:
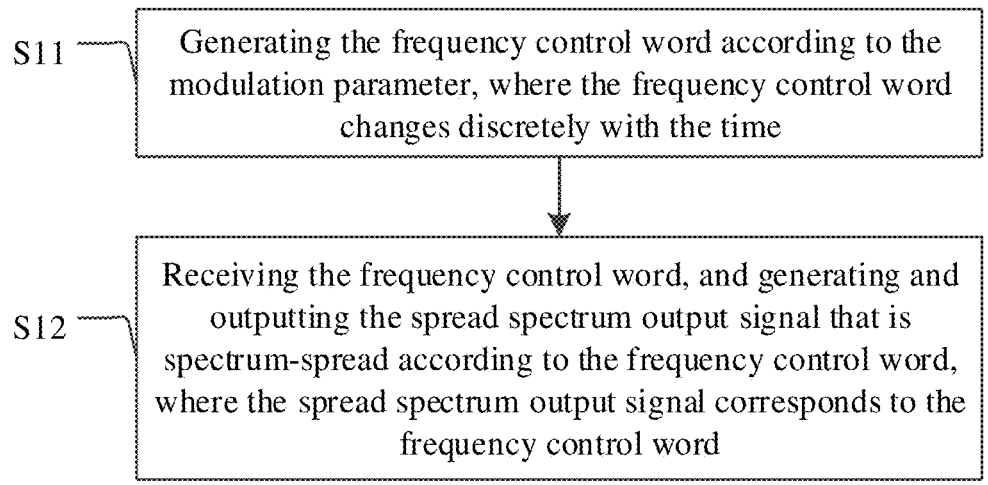
FIG. 16A is a schematic flowchart of a clock spread spectrum method provided by some embodiments of the present disclosure.
Figure 16B:
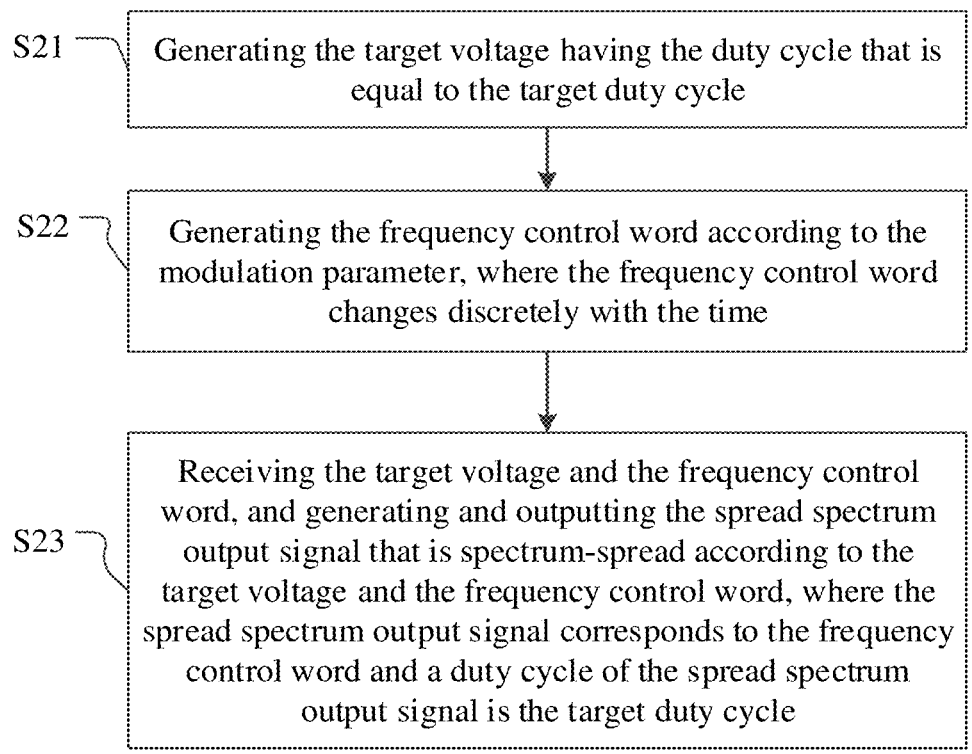
FIG. 16B is a schematic flowchart of another clock spread spectrum method provided by some embodiments of the present disclosure.

At least one embodiment of the present disclosure further provides a clock spread spectrum method. FIG. 16A is a schematic flowchart of a clock spread spectrum method provided by some embodiments of the present disclosure, FIG. 16B is a schematic flowchart of another clock spread spectrum method provided by some embodiments of the present disclosure. The clock spread spectrum method provided by the embodiments of the present disclosure may be implemented based on the clock spread spectrum circuit according to any one of the embodiments of the present disclosure.

For example, as illustrated in FIG. 16A, the clock spread spectrum method provided by the embodiments of the present disclosure may include the following steps.

S11: generating the frequency control word according to the modulation parameter, where the frequency control word changes discretely with the time.

S12: receiving the frequency control word, and generating and outputting the spread spectrum output signal that is spectrum-spread according to the frequency control word, where the spread spectrum output signal corresponds to the frequency control word.

For example, as illustrated in FIG. 16B, in other embodiments, the clock spread spectrum method provided by the embodiments of the present disclosure may include the following steps.

S21: generating the target voltage having the duty cycle that is equal to the target duty cycle.

S22: generating the frequency control word according to the modulation parameter, where the frequency control word changes discretely with the time.

S23: receiving the target voltage and the frequency control word, and generating and outputting the spread spectrum output signal that is spectrum-spread according to the target voltage and the frequency control word, where the spread spectrum output signal corresponds to the frequency control word and a duty cycle of the spread spectrum output signal is the target duty cycle.

The clock spread spectrum method provided by the embodiments of the present disclosure may implement to turn on the spread spectrum functions of various modulation modes (such as the triangle wave modulation mode, and the sawtooth wave modulation mode), and can not introduce additional noise when the spread spectrum function is turned on, that is, can effectively reduce electromagnetic interference without affecting the normal operation of the circuit system.

For example, the frequency control word may include a decimal part and an integer part, the integer part is an integer, the decimal part changes discretely with time, the decimal part is a decimal, and the range of the decimal part is [0,1).

For example, the modulation parameter includes a spread spectrum depth coefficient, a spread spectrum reference value, a modulation mode, a modulation rate, and a reference frequency, which correspond to the spread spectrum output signal. Step S11 may include: generating the decimal part according to the spread spectrum depth coefficient, the spread spectrum reference value, the modulation mode, and the modulation rate; generating the integer part according to the reference frequency; and generating the frequency control word according to the decimal part and the integer part.

For example, in step S12, the spread spectrum output signal may be generated by the TAF-DPS.

It should be noted that, for the description of the clock spread spectrum method, reference may be made to the above description of the clock spread spectrum circuit. The clock spread spectrum methods illustrated in FIG. 16A and FIG. 16B may be implemented by the clock spread spectrum circuit according to any one of the embodiments of the present disclosure. For example, step S21 may be implemented by the duty cycle adjustment circuit in the clock spread spectrum circuit according to any one of the embodiments of the present disclosure, step S11 and step S22 may be implemented by the control circuit in the clock spread spectrum circuit according to any one of the embodiments of the present disclosure, step S12 and step S23 may be implemented by the signal generation circuit in the clock spread spectrum circuit according to any one of the embodiments of the present disclosure, and similar operations or steps are not described herein again.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a structure may be enlarged. It should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:
1. A clock spread spectrum circuit, comprising:
   a duty cycle adjustment circuit, configured to generate a target voltage having a duty cycle that is equal to a target duty cycle;
   a control circuit, configured to generate a frequency control word according to a modulation parameter, wherein the frequency control word changes discretely with time; and
   a signal generation circuit, configured to receive the target voltage and the frequency control word and generate and output a spread spectrum output signal that is spectrum-spread according to the target voltage and the frequency control word, wherein the spread spectrum output signal corresponds to the frequency control word and a duty cycle of the spread spectrum output signal is the target duty cycle;
   wherein the frequency control word is expressed as:

$$F(t)=I+r(t),$$

wherein F(t) is the frequency control word, I is an integer part of the frequency control word, I is a constant and an integer, r(t) is a decimal part of the frequency control word, r(t) is a decimal and discretely changes with the time, and t represents the time.

2. The clock spread spectrum circuit according to claim 1, wherein the duty cycle adjustment circuit comprises a duty cycle control signal generation sub-circuit, a voltage conversion sub-circuit, and an initial voltage generation sub-circuit,
   the duty cycle control signal generation sub-circuit is configured to generate a duty cycle control signal having a duty cycle that is equal to the target duty cycle,
   the initial voltage generation sub-circuit is configured to generate an initial voltage, and
   the voltage conversion sub-circuit is configured to convert the initial voltage based on the duty cycle control signal to obtain the target voltage.

3. The clock spread spectrum circuit according to claim 2, wherein the duty cycle control signal generation sub-circuit comprises: a control word providing module and a duty cycle control signal generation module;
   the control word providing module is configured to obtain the target duty cycle, generate a first duty cycle control word and a second duty cycle control word based on the target duty cycle, and output the first duty cycle control word and the second duty cycle control word to the duty cycle control signal generation module, wherein a ratio of the first duty cycle control word and the second duty cycle control word is equal to the target duty cycle;
   the duty cycle control signal generation module is configured to, in response to the first duty cycle control word and the second duty cycle control word, generate the duty cycle control signal.

4. The clock spread spectrum circuit according to claim 3, wherein the duty cycle control signal generation module comprises: a comparison sub-module, a generation sub-module, and an output selection sub-module;
   the control word providing module is configured to output the first duty cycle control word and the second duty cycle control word to the comparison sub-module;
   the comparison sub-module is configured to judge whether the first duty cycle control word and the second duty cycle control word are equal or not, output the first duty cycle control word and the second duty cycle control word to the generation sub-module and output a first control signal to the output selection sub-module if the first duty cycle control word and the second duty cycle control word are not equal; and output a second control signal to the output selection sub-module if the first duty cycle control word and the second duty cycle control word are equal;

the generation sub-module is configured to generate the duty cycle control signal and output the duty cycle control signal to the output selection sub-module in response to receiving the first duty cycle control word and the second duty cycle control word; and the output selection sub-module is configured to output the duty cycle control signal generated by the generation sub-module in response to receiving the first control signal, and output a default control signal having a duty cycle that is equal to 1 as the duty cycle control signal in response to receiving the second control signal.

5. The clock spread spectrum circuit according to claim 4, wherein the generation sub-module comprises: a base output signal generation unit and a duty cycle control signal generation unit;

the base output signal generation unit is configured to generate a plurality of first base output signals and output the plurality of first base output signals to the duty cycle control signal generation unit, wherein a phase difference between any two adjacent first base output signals is equal to a fixed value;

the duty cycle control signal generation unit is configured to generate the duty cycle control word based on the plurality of first base output signals, and the first duty cycle control word and the second duty cycle control word output by the comparison sub-module, and output the duty cycle control signal to the output selection sub-module.

6. The clock spread spectrum circuit according to claim 5, wherein the duty cycle control signal generation unit comprises: an input unit, a selection unit, and an output unit;

the input unit is configured to output a selection control signal to the selection unit based on the first duty cycle control word and the second duty cycle control word;

the selection unit is configured to select a first base output signal from the plurality of first base output signals as a target first base output signal in response to the selection control signal and output the target first base output signal to the output unit; and the output unit is configured to generate the duty cycle control signal based on the target first base output signal, and output the duty cycle control signal to the output selection sub-module.

7. The clock spread spectrum circuit according to claim 6, wherein the input unit comprises: a first register, a second register, a third register, a fourth register, a first adder, and a second adder; the selection unit comprises: a first selector, a second selector, and a third selector; the output unit comprises: a D flip-flop, a first inverter, and a second inverter;

the first adder and the second adder are connected to the control word providing module;

the first adder, the first register, the second register, and the first selector are connected in sequence;

the second adder, the third register, the fourth register, and the second selector are connected in sequence;

the second register is also connected to a first clock signal terminal;

the first register, the third register, and the fourth register are also connected to a second clock signal terminal;

the first adder is configured to add the first duty cycle control word and information stored in the third register to obtain a first addition result, and store the first addition result in the first register at a first rising edge of a second clock signal provided by the second clock signal terminal connected to the first register, the second register is configured to store the first addition result stored in the first register at a first rising edge of a first clock signal provided by the first clock signal terminal connected to the second register, and output the first addition result to the first selector;

the second adder is configured to add the second duty cycle control word and the information stored in the third register to obtain a second addition result, and store the second addition result in the third register at a second rising edge of the second clock signal provided by the second clock signal terminal connected to the third register, the fourth register is configured to store the second addition result stored in the third register at a third rising edge of the second clock signal provided by the second clock signal terminal connected to the fourth register, and output the second addition result to the second selector;

the selection control signal comprises the first addition result and the second addition result, the first selector and the second selector are connected to the base output signal generation unit and the third selector, and the third selector is also connected to a first input end of the D flip-flop and the first clock signal terminal;

the first selector is configured to select a first base output signal from the plurality of first base output signals as a first selected first base output signal in response to the first addition result output by the second register, and output the first selected first base output signal to the third selector;

the second selector is configured to select a first base output signal from the plurality of first base output signals as a second selected first base output signal in response to the second addition result output by the fourth register, and output the second selected first base output signal to the third selector;

the third selector is configured to select one of the first selected first base output signal and the second selected first base output signal as the target first base output signal at a second rising edge of the first clock signal provided by the first clock signal terminal, and output the target first base output signal to the D flip-flop;

a second input end of the D flip-flop is connected to an output end of the first inverter, an input end of the first inverter and an input end of the second inverter are both connected to an output end of the D flip-flop, and the D flip-flop is configured to generate the duty cycle control signal based on the target first base output signal and output the duty cycle control signal to the output selection sub-module.

8. The clock spread spectrum circuit according to claim 3, wherein the first duty cycle control word and the second duty cycle control word both are positive integers.

9. The clock spread spectrum circuit according to claim 3, wherein the control word providing module comprises: a controller and a memory, the memory stores a plurality of duty cycle control word pairs, each of the plurality of duty cycle control word pairs comprises a first candidate duty cycle control word and a second candidate duty cycle control word, a plurality of candidate ratios corresponding to the plurality of duty cycle control word pairs are different from each other, wherein a candidate ratio corresponding to a duty cycle control word pair represents a ratio of a first candidate duty cycle control word and a second candidate duty cycle control word comprised in the duty cycle control word pair;
    the controller is configured to determine a target duty cycle control word pair from the plurality of duty cycle control word pairs based on the target duty cycle, wherein a ratio of a first candidate duty cycle control word and a second candidate duty cycle control word comprised in the target duty cycle control word pair is equal to the target duty cycle;
    the controller is further configured to determine the first candidate duty cycle control word comprised in the target duty cycle control word pair as the first duty cycle control word, and determine the second candidate duty cycle control word comprised in the target duty cycle control word pair as the second duty cycle control word.

10. The clock spread spectrum circuit according to claim 1, wherein the modulation parameter comprises a spread spectrum depth coefficient, a spread spectrum reference value, a modulation rate, a reference frequency, and a modulation mode, which correspond to the spread spectrum output signal, and
    the control circuit comprises:
        a decimal generation sub-circuit, configured to generate the decimal part according to the spread spectrum depth coefficient, the spread spectrum reference value, the modulation mode, and the modulation rate;
        an integer generation sub-circuit, configured to generate the integer part according to the reference frequency; and
        a synthesis sub-circuit, configured to receive the decimal part and the integer part and generate the frequency control word based on the decimal part and the integer part.

11. The clock spread spectrum circuit according to claim 10, wherein the decimal generation sub-circuit comprises:
    a frequency modulation control module, configured to generate a frequency modulation clock signal according to the modulation rate to control a rate of change of the frequency control word; and
    a decimal generation module, configured to generate and output the decimal part to the synthesis sub-circuit according to the modulation mode, the spread spectrum depth coefficient, and the spread spectrum reference value under control of the frequency modulation clock signal.

12. The clock spread spectrum circuit according to claim 11, wherein the decimal generation module comprises a modulation mode sub-module,
    the modulation mode comprises a triangle modulation mode, a sawtooth modulation mode, a sinusoidal modulation mode, or a random modulation mode, and
    the modulation mode sub-module is configured to generate the decimal part by using any one modulation mode selected from a group consisting of the triangle modulation mode, the sawtooth modulation mode, the sinusoidal modulation mode, and the random modulation mode.

13. The clock spread spectrum circuit according to claim 12, wherein the frequency modulation control module comprises:
    a counting sub-module, configured to count a reference clock signal to obtain a count value of the reference clock signal; and
    a timing sub-module, configured to determine a count period according to the modulation rate and determine the frequency modulation clock signal based on the count period and the count value.

14. The clock spread spectrum circuit according to claim 1, wherein the signal generation circuit comprises:
    a base time unit generation sub-circuit, configured to receive the target voltage and generate and output a base time unit based on the target voltage; and
    a spread spectrum sub-circuit, configured to generate and output the spread spectrum output signal according to the frequency control word and the base time unit.

15. The clock spread spectrum circuit according to claim 14, wherein the base time unit generation sub-circuit comprises:
    a voltage-controlled oscillator, configured to oscillate at a frequency of the target voltage;
    a phase-locked loop circuit, configured to lock an output frequency of the voltage-controlled oscillator to a base output frequency; and
    K output terminals, configured to output K second base output signals with phases evenly spaced, wherein K is a positive integer greater than 1,
    wherein the base output frequency is expressed as $f_d$, the base time unit is a time span between any two adjacent second base output signals output by the K output terminals, the base time unit is expressed as $\Delta$, and $\Delta=1/(K \cdot f_d)$, and a duty cycle of each of the K second base output signals is the target duty cycle.

16. The clock spread spectrum circuit according to claim 14, wherein the spread spectrum sub-circuit is a time average frequency direct period synthesizer.

17. The clock spread spectrum circuit according to claim 1, wherein a maximum value of the frequency control word and a minimum value of the frequency control word satisfy a formula: 0≤Fmax−Fmin<1,
    wherein Fmin represents the minimum value of the frequency control word, and Fmax represents the maximum value of the frequency control word.

18. An electronic equipment, comprising a clock spread spectrum circuit,
    wherein the clock spread spectrum circuit comprises:
    a duty cycle adjustment circuit, configured to generate a target voltage having a duty cycle that is equal to a target duty cycle;
    a control circuit, configured to generate a frequency control word according to a modulation parameter, wherein the frequency control word changes discretely with time; and
    a signal generation circuit, configured to receive the target voltage and the frequency control word and generate and output a spread spectrum output signal that is spectrum-spread according to the target voltage and the frequency control word, wherein the spread spectrum output signal corresponds to the frequency control word and a duty cycle of the spread spectrum output signal is the target duty cycle;
    wherein the frequency control word is expressed as:

$F(t)=I+r(t)$, wherein F(t) is the frequency control word, I is an integer part of the frequency control word, I is a constant and an integer, r(t) is a decimal part of the frequency control word, r(t) is a decimal and discretely changes with the time, and t represents the time.

19. A clock spread spectrum method, applied to a clock spread spectrum circuit, wherein the clock spread spectrum circuit comprises:

a duty cycle adjustment circuit, configured to generate a target voltage having a duty cycle that is equal to a target duty cycle;

a control circuit, configured to generate a frequency control word according to a modulation parameter, wherein the frequency control word changes discretely with time; and a signal generation circuit, configured to receive the target voltage and the frequency control word and generate and output a spread spectrum output signal that is spectrum-spread according to the target voltage and the frequency control word, wherein the spread spectrum output signal corresponds to the frequency control word and a duty cycle of the spread spectrum output signal is the target duty cycle;

wherein the frequency control word is expressed as:

$$F(t)=I+r(t),$$

wherein F(t) is the frequency control word, I is an integer part of the frequency control word, I is a constant and an integer, r(t) is a decimal part of the frequency control word, r(t) is a decimal and discretely changes with the time, and t represents the time, the clock spread spectrum method comprises:

generating the target voltage having the duty cycle that is equal to the target duty cycle;

generating the frequency control word according to the modulation parameter; and receiving the target voltage and the frequency control word, and generating and outputting the spread spectrum output signal that is spectrum-spread according to the target voltage and the frequency control word.

20. The clock spread spectrum method according to claim 19, wherein the modulation parameter comprises a spread spectrum depth coefficient, a spread spectrum reference value, a modulation mode, a modulation rate, and a reference frequency, which correspond to the spread spectrum output signal, and generating the frequency control word according to the modulation parameter comprises:

generating the decimal part according to the spread spectrum depth coefficient, the spread spectrum reference value, the modulation mode, and the modulation rate, wherein the decimal part is a decimal and changes discretely with the time;

generating the integer part according to the reference frequency, wherein the integer part is an integer; and generating the frequency control word according to the decimal part and the integer part.

\* \* \* \* \*